(12) United States Patent
Krinitt et al.

(10) Patent No.: US 10,178,789 B2
(45) Date of Patent: Jan. 8, 2019

(54) ENCLOSURE MOUNTING SYSTEM

(71) Applicant: SGI Matrix, LLC, Miamisburg, OH (US)

(72) Inventors: Jeremy Krinitt, Concord, MA (US); Peter Jekel, Wesford, MA (US); Daniel Piening, Cincinnati, OH (US); Dennis R. Meece, Dayton, OH (US); Curtis J. Fansler, Dayton, OH (US)

( * ) Notice: Subject to any disclaimer, the term of this patent is extended or adjusted under 35 U.S.C. 154(b) by 23 days.

(21) Appl. No.: 15/584,446

(22) Filed: May 2, 2017

(65) Prior Publication Data

US 2017/0303421 A1    Oct. 19, 2017

Related U.S. Application Data

(63) Continuation of application No. 14/867,451, filed on Sep. 28, 2015, now abandoned.

(60) Provisional application No. 62/056,578, filed on Sep. 28, 2014, provisional application No. 62/055,810, filed on Sep. 26, 2014.

(51) Int. Cl.
*H05K 7/14*     (2006.01)
*H05K 5/02*     (2006.01)
*A47B 96/06*    (2006.01)

(52) U.S. Cl.
CPC ............ *H05K 7/14* (2013.01); *A47B 96/067* (2013.01); *H05K 5/0204* (2013.01)

(58) Field of Classification Search
CPC ............ H02G 3/08; H02G 3/081; H02G 3/12; H02G 3/121; H02G 3/083; H02G 3/125; H02G 3/128; H02G 3/126; H05K 5/00; H05K 5/02; H05K 5/0204; H05K 5/0217; H02B 1/40; H02B 1/306; H01R 13/518; H01R 13/516
USPC ... 174/50, 520, 480, 481, 559, 560, 57, 135; 439/535; 361/600, 601, 724, 727, 730; 248/906, 200.1, 200
See application file for complete search history.

(56) References Cited

U.S. PATENT DOCUMENTS

| | | | | |
|---|---|---|---|---|
| 3,528,636 A | * | 9/1970 | Schmidt ................. | H02G 3/126 220/3.9 |
| 3,633,782 A | * | 1/1972 | Bellinger ............... | H02G 3/123 220/3.5 |
| 4,757,967 A | * | 7/1988 | Delmore ................ | H02G 3/126 248/906 |
| 4,964,525 A | * | 10/1990 | Coffey ................... | H02G 3/125 248/906 |
| 4,967,990 A | * | 11/1990 | Rinderer ................ | H02G 3/125 248/906 |

(Continued)

*Primary Examiner* — Angel R Estrada

(57) ABSTRACT

An enclosure mounting system includes a bracket with a rigid body having first, second, and third parallel surfaces wherein the first and third surfaces are on one plane and the second surface is on a different plane. The first surface has at least two notches generally disposed at opposite ends of the first surface and a plurality of first surface fastening holes disposed along the length of the first surface. The second surface has at least two slide mounting openings and at least one second surface fastening hole. The third surface has a plurality of fastening holes disposed along the length of the third surface. The bracket is configured to fasten to a wall and to an enclosure while permitting the enclosure to also fasten to the the wall. The enclosure is mounted by leveling the bracket and fastening the bracket and enclosure to each other and the wall.

20 Claims, 23 Drawing Sheets

(56) References Cited

U.S. PATENT DOCUMENTS

| | | | | |
|---|---|---|---|---|
| 6,079,677 | A * | 6/2000 | Daoud | H02G 3/16 |
| | | | | 248/201 |
| 7,173,186 | B1 * | 2/2007 | Hageman | H02G 3/125 |
| | | | | 174/57 |
| 7,312,396 | B1 * | 12/2007 | Gorman | H02G 3/128 |
| | | | | 174/480 |
| 7,595,447 | B2 * | 9/2009 | Vrame | H01R 13/518 |
| | | | | 174/57 |
| 8,669,471 | B2 * | 3/2014 | Temblador | H02G 3/085 |
| | | | | 174/50 |

* cited by examiner

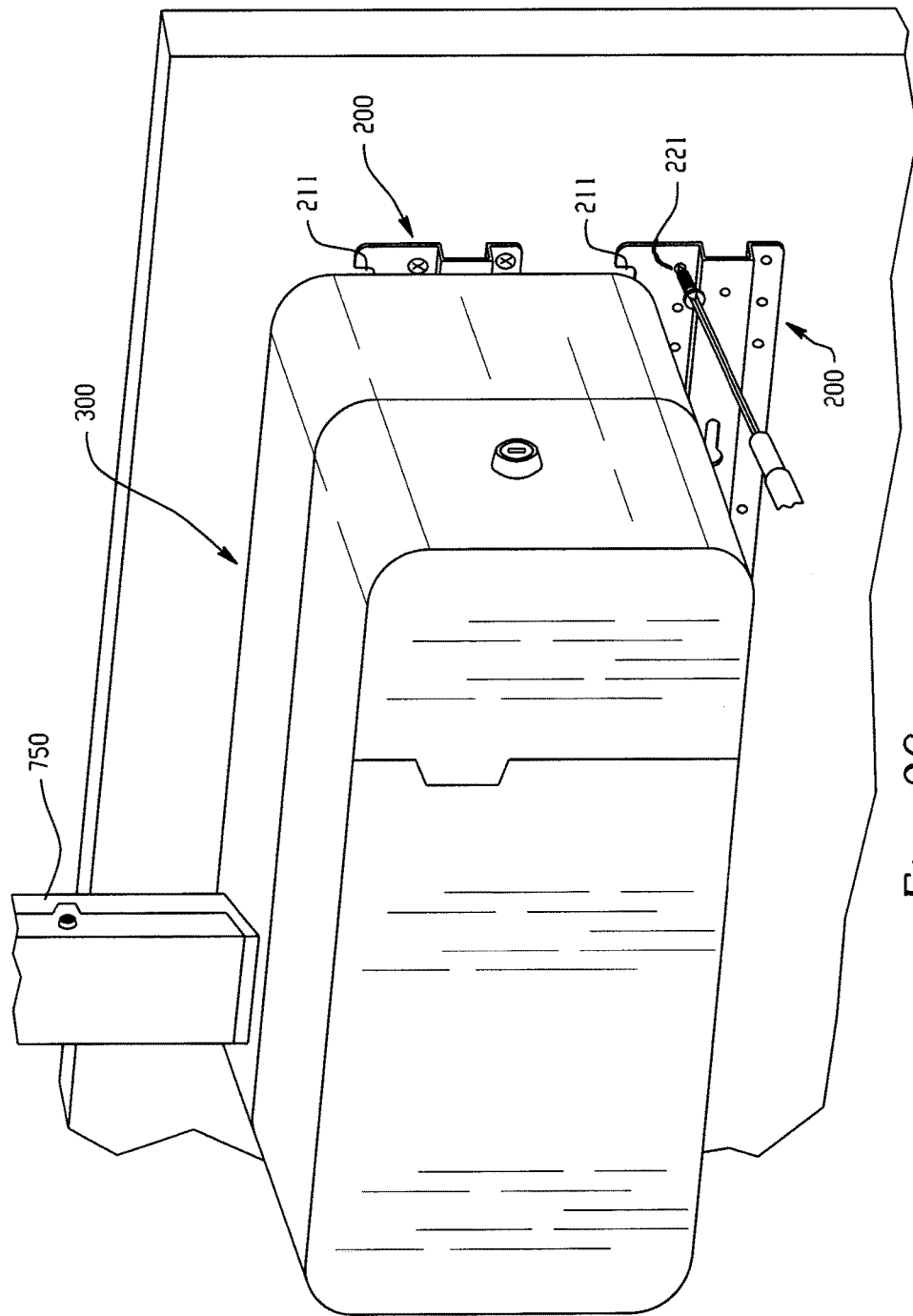

ENCLOSURE MOUNTING SYSTEM

CROSS-REFERENCE TO RELATED APPLICATION

This Continuation Patent Application claims priority to U.S. Non-Provisional Patent Application Ser. No. 14/867,451 filed on Sep. 28, 2015 entitled "Security Panel Enclosure and Mounting System," which is incorporated by reference in its entirety as if fully set forth herein. This Continuation Patent Application claims priority to and claims the benefit of U.S. Provisional Patent Application Ser. No. 62/056,578, entitled "Security Panel Enclosure," filed Sep. 28, 2014, which is incorporated by reference in its entirety as if fully set forth herein. This Continuation Patent Application claims priority to and claims the benefit of U.S. Provisional Patent Application Ser. No. 62/055,810, entitled "Enclosure Mounting Bracket System," filed Sep. 26, 2014, which is incorporated by reference in its entirety as if fully set forth herein.

FIELD

The described apparatus and method generally relates to the field of enclosures, specificably electronic component enclosures, mounting brackets, and installation methods therefore.

BACKGROUND AND SUMMARY

The secure storage of vertically mounted electronic components can take up substantial wall space. By mounting hardware in an enclosure on the door of the enclosure as well as on the wall side of the enclosure, half of the necessary wall space is required. Traditionally, mounting hardware on the door of an enclosure has been performed in the field but is done in a manner that is not effective. For example, existing methods may involve double sided tape with no wire management, risking the hardware and integrity of the solution being provided. Also, existing installation methods may require more than one worker to install the enclosures.

The disclosed electronic component enclosure provides a more effective and efficient means of mounting electronic components in an enclosure.

For example, a mountable enclosure for electronic components can include a base having a generally box shape open on one side and forming a base storage area within the interior of the base. The base can include an exterior base mounting surface, such as a back wall of the enclosure for example. The exterior base mounting surface can have at least two pegs configured to stand the base off of a wall. The exterior base mounting surface can have at least two base mating portions, for example shoulder screws. The exterior base mounting surface can have at least two base fastening holes. In some examples, four base fastening holes may be used: two for fastening the enclosure to a bracket and two for fastening the enclosure to the wall.

The enclosure can include a door having a generally box shape open on one side forming a door storage area within the interior of the door. The door can be pivotally connected to the base along a vertical axis, forming a joint. In some examples, a flexible material can be used to cover a portion of the joint to protect wires from being pinched.

The enclosure can include a plurality of electronic component mounting areas within the base storage area and the door storage area.

The enclosure can include a plurality of horizontal cable management areas within the base storage area and the door storage area.

The enclosure can include a vertical cable management area located in the base storage area and configured to permit a cable to pass vertically through the enclosure. In some examples, punch-outs in the ceiling and floor of the vertical cable management area allow the user to create holes to allow cables to extend outside of the enclosure. In some examples, the enclosure can also include a vertical cable management area located in the door storage area and which is likewise configured to permit a cable to pass vertically through the enclosure.

In some examples, the enclosure can include a separated compartment for batteries or other power-specific components.

In some examples, external labeling can be used to reference the contents of the enclosure.

In some examples, multiple enclosures may be used. In some examples, the enclosures are all sized modularly. In some examples the modular enclosures have the same width but differing heights of a modular sizing. Larger enclosures can hold a greater number of electronic component mounting areas and horizontal cable management areas.

The enclosures can be configured in a number of different ways. In some examples, an enclosure may have one, two, three or more electronic component mounting areas in its door or its base. In other examples, an enclosure may have one, two, three or more electronic component mounting areas in its door or its base. In other examples, one or more vertical cable management areas can be included in the base or the door.

In some examples, a base or a door of an enclosure may be used for general storage and not contain any electronic component mounting areas, horizontal cable management areas, or vertical cable management areas. Alternatively, the enclosure could include some or all of these elements within its base, within its door, or both. For example, an enclosure may include a vertical cable management area in its base to allow for the passage of a cable from above the enclosure to another enclosure below the first enclosure and not contain any electronic component mounting areas or horizontal cable management areas.

In some examples, the bottom and top of a base and a door of an enclosure can be the same depth. In other examples, where a large item such as a battery is to be stored, the bottom of the base can be relatively deeper than its top and the cooperating door can have a relatively smaller bottom and larger top.

In some examples, an extra compartment for storing extra cable can be included above and in communication with the vertical cable storage management area. In some examples, the extra cable management area can have a removable face panel to provide access to the cables. In some cases, the extra cable management area can have punch-out sections permitting the user to create a hole or holes at the top of the extra cable management area.

In some examples of multiple enclosures, a cable can be passed through multiple enclosures. For example, a cable can extend from the extra cable management area down through the vertical cable management area of the base of the top most enclosure, down and through the vertical cable management area of the base of the next enclosure, etc.

An example of an electronic component enclosure mounting system can include at least one enclosure, as described above, and also at least one bracket.

The bracket can include a rigid body having first, second, and third parallel surfaces wherein the first and third surfaces are on one plane and the second surface is on a different plane. The first surface can have at least two alignment notches, for example, notches disposed generally at opposite ends of the first surface, and a plurality of first surface fastening holes disposed along the length of the first surface.

The second surface having at least two slide mounting openings and at least one second surface fastening hole.

The third surface can have a plurality of third surface fastening holes disposed along the length of the third surface.

The bracket can be fastened to the wall and the enclosure can be fastened to the bracket and the wall. In some cases, more than one enclosure may be mounted to a wall.

Also disclosed are methods of installation for an an electronic component enclosure system including one or more enclosures that is easier to perform than traditional wall-mounted component systems and which can be accomplished by a single person.

This method can begin with the step of leveling a first bracket and then fastening the bracket to the wall. Next, the enclosure can be fastened to the bracket by inserting base mating portions of the enclosure into slideable mounting openings of the bracket. For example, the base mating portions could be shoulder screws or any other protrusion adapted to mate with the bracket. The slideable mounting openings of the bracket could be key-hole style receiving holes permitting mating hardware to be inserted into the hole and then slid along a horizontal groove to lock it in place. In sliding the mating hardware to lock the enclosure onto the bracket the user can also align the base fastening hole with the bracket fastening hole and thereafter fasten the enclosure to the bracket using a fastener inserted through the fastening holes.

A second bracket can be installed below the first bracket by inserting notches located at the top corners of the second bracket into pegs extending from the first enclosure. In this way, the user does not need to use a level to position the second bracket in alignment with the first.

The second bracket and a second enclosure can then be installed following the same steps as above. Subsequent enclosures and subsequent brackets can likewise be installed below previously installed enclosures following these same steps.

BRIEF DESCRIPTION OF THE DRAWINGS

FIGS. 18-30 depict steps of a method of installing enclosures with brackets.

DETAILED DESCRIPTION

Figure 1:
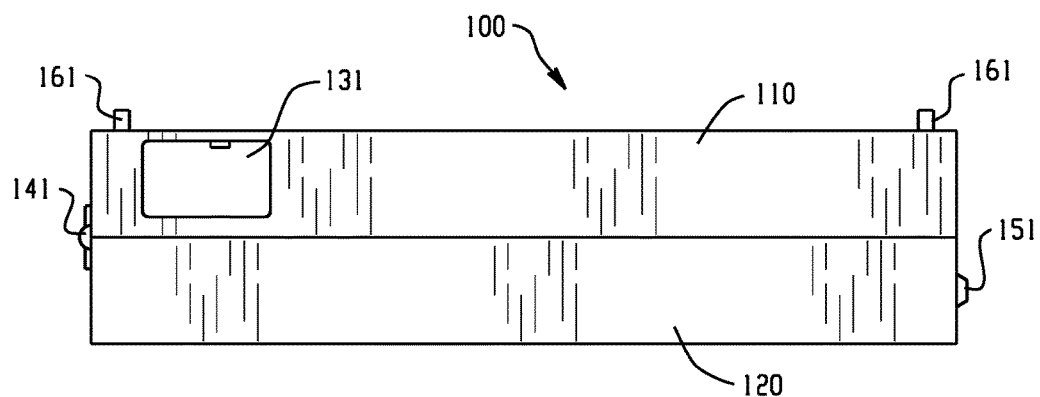
FIG. 1 is a top view of an enclosure in a closed position.
Figure 2:
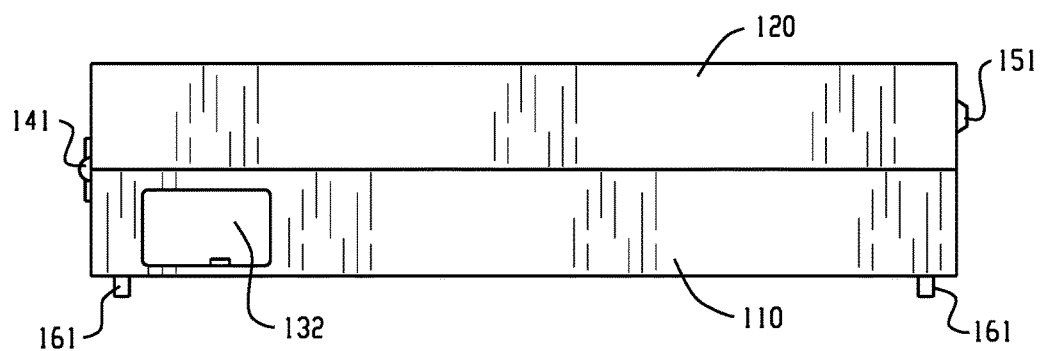
FIG. 2 is a bottom view of an enclosure in a closed position.
Figure 3:
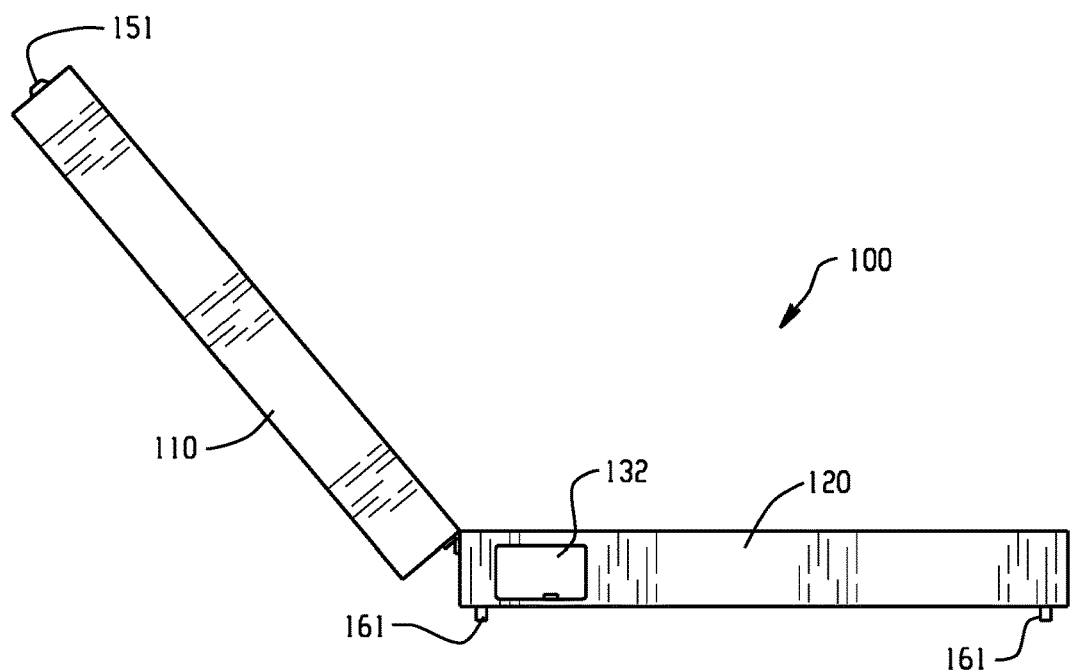
FIG. 3 is a bottom view of an enclosure in an open position.
Figure 4:
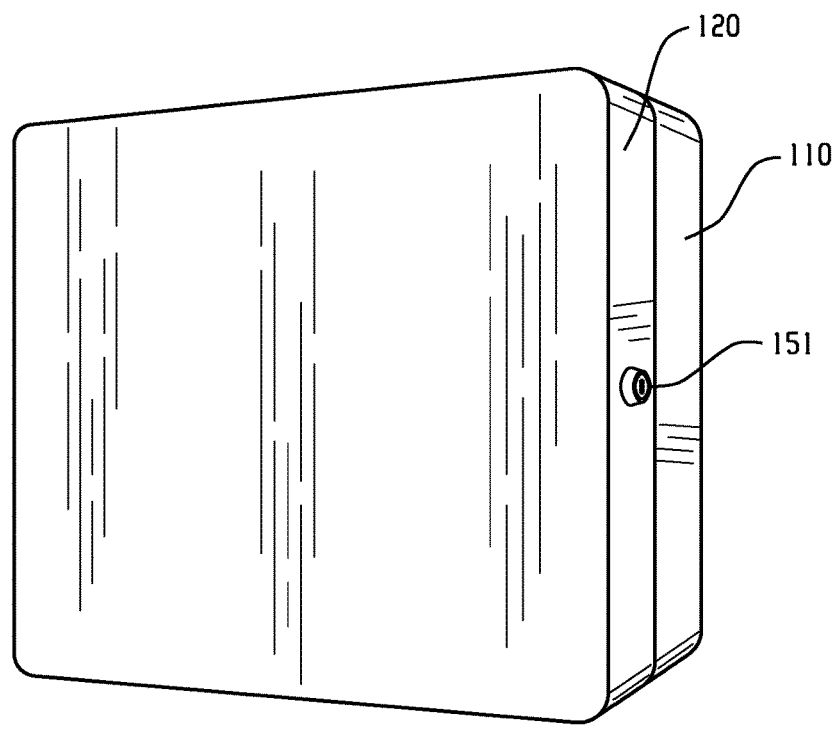
FIG. 4 is a perspective view of an enclosure in a closed position.

The apparatuses and methods disclosed and described in this document are described in detail with reference to the views and examples of the included figures. Those of ordinary skill in this art will recognize that modifications to disclosed and described components, elements, methods, materials, and so forth can be made and can be desired for a specific application.

As shown in the different views provided by FIGS. 1-5, and enclosure 100 can have a base 110 and a door 120, which can be pivotally connected with one or more hinges 141 or any other suitable connector. The enclosure can be locked in a closed position, for example, by using a key in an enclosure key hole 151. The base of the enclosure can have pegs 161 allowing the enclosure to stand-off from the wall when installed.

The base can also have a top base opening 131 and a bottom base opening 132. In some examples, the openings are created by punching out scored, perforated, or otherwise weakened portions of the base. In other examples, a removable cover can be used in connection with the openings. During installation, removable coverings can be removed if they interfere with installation of a bracket.

Figure 5:
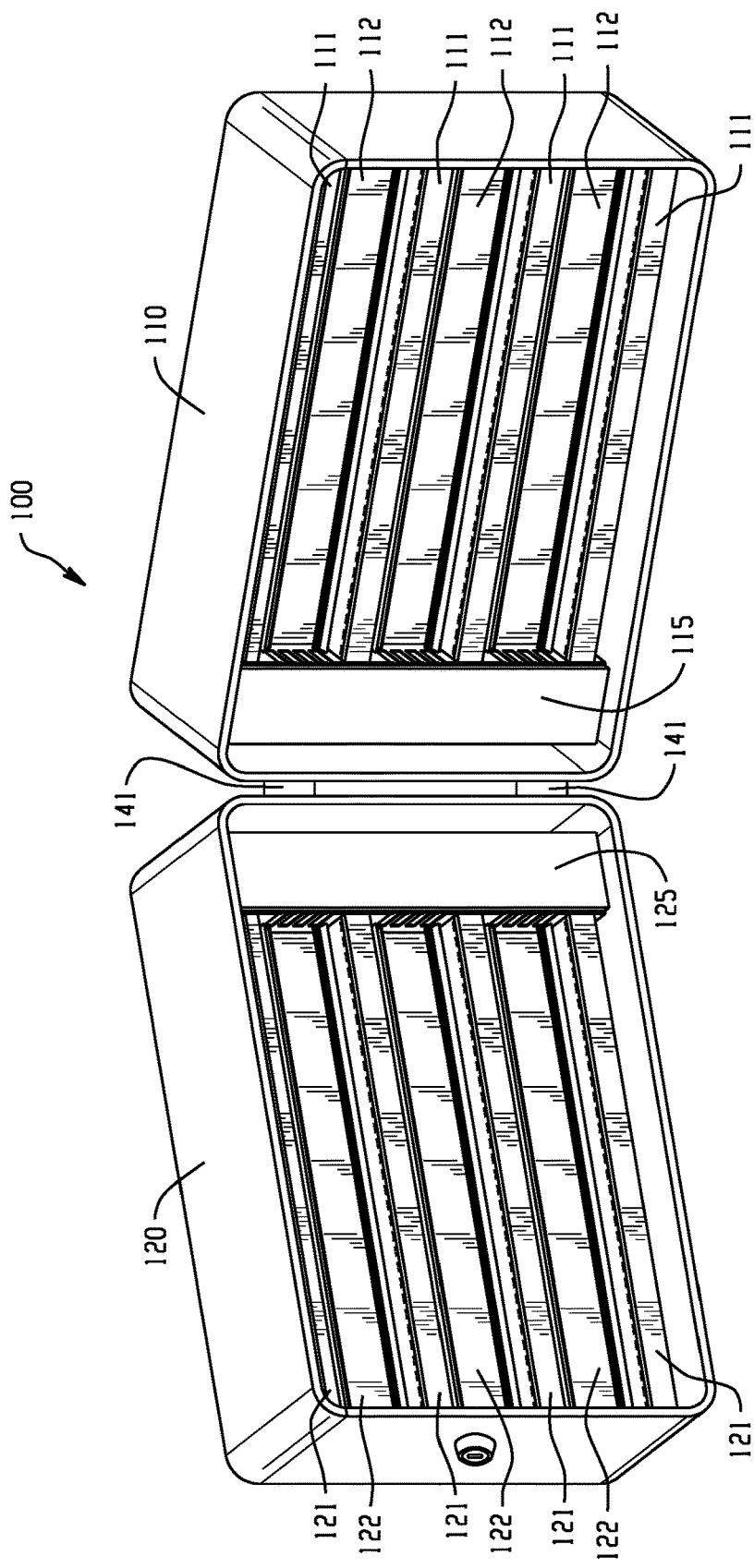
FIG. 5 is a perspective view of an enclosure in an open position.

As shown in FIG. 5, the base 110 can include a base storage area with one or more base electronic component mounting areas 112, one or more base horizontal cable management areas 111, and one or more base vertical cable management areas 115. As also shown, the door 120 can include a door storage area with one or more door electronic component mounting areas 122, one or more door horizontal cable management areas 121, and one or more door vertical cable management areas 125. These elements can be configured in any combination to fit user needs within the base and door storage areas.

Figure 6:
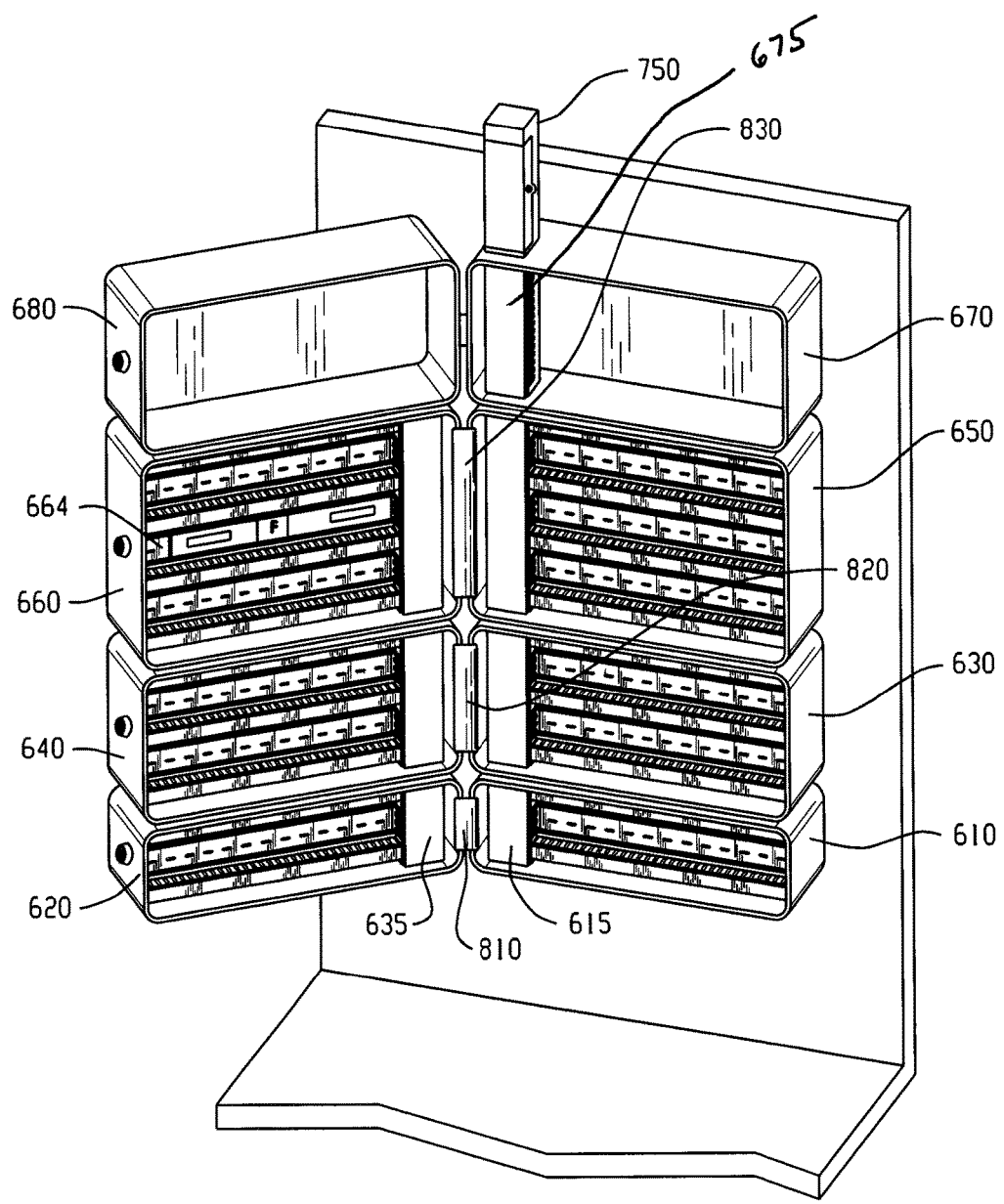
FIG. 6 is a perspective view of multiple enclosures mounted and in open positions.
Figure 7:
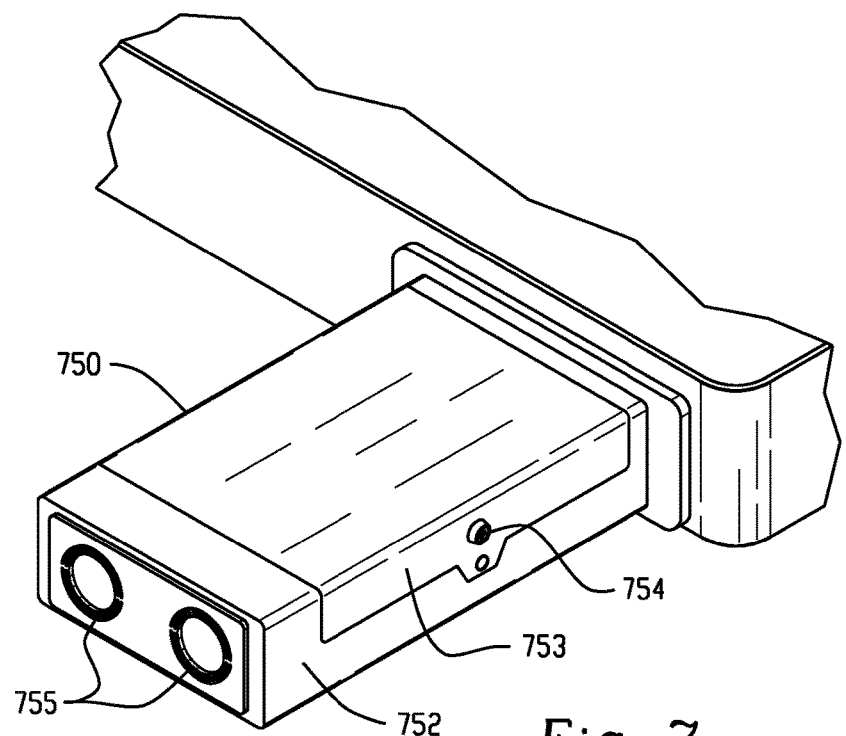
FIG. 7 is a perspective view of an extra cable management area.
Figure 8:
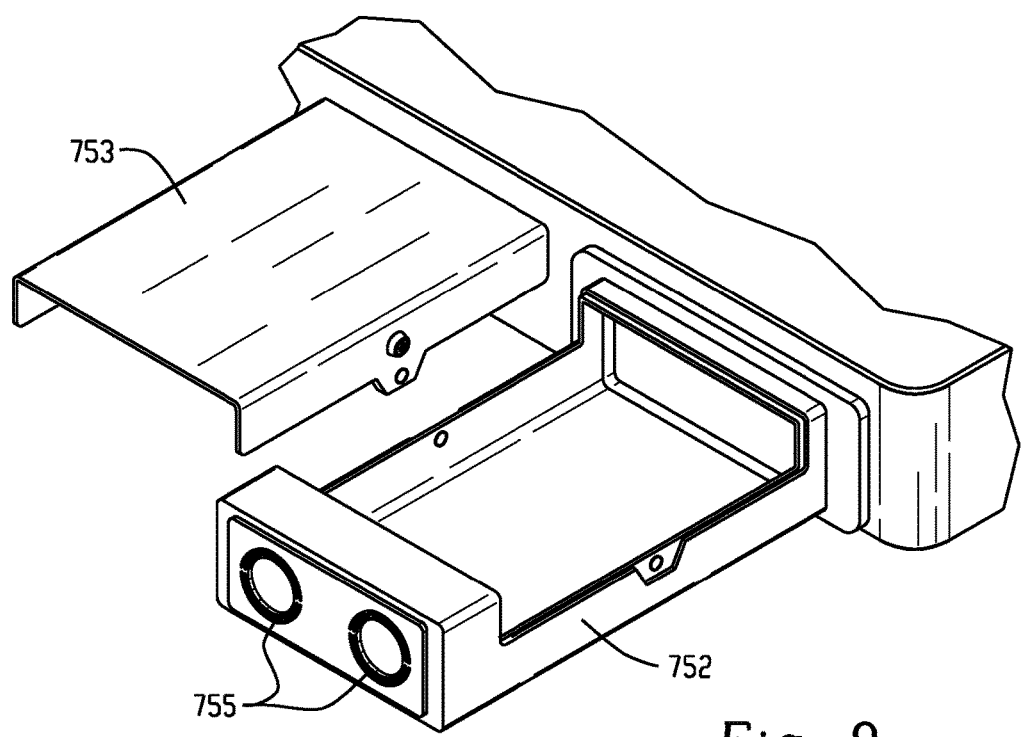
FIG. 8 is a perspective view of an extra cable management area.
Figure 9:
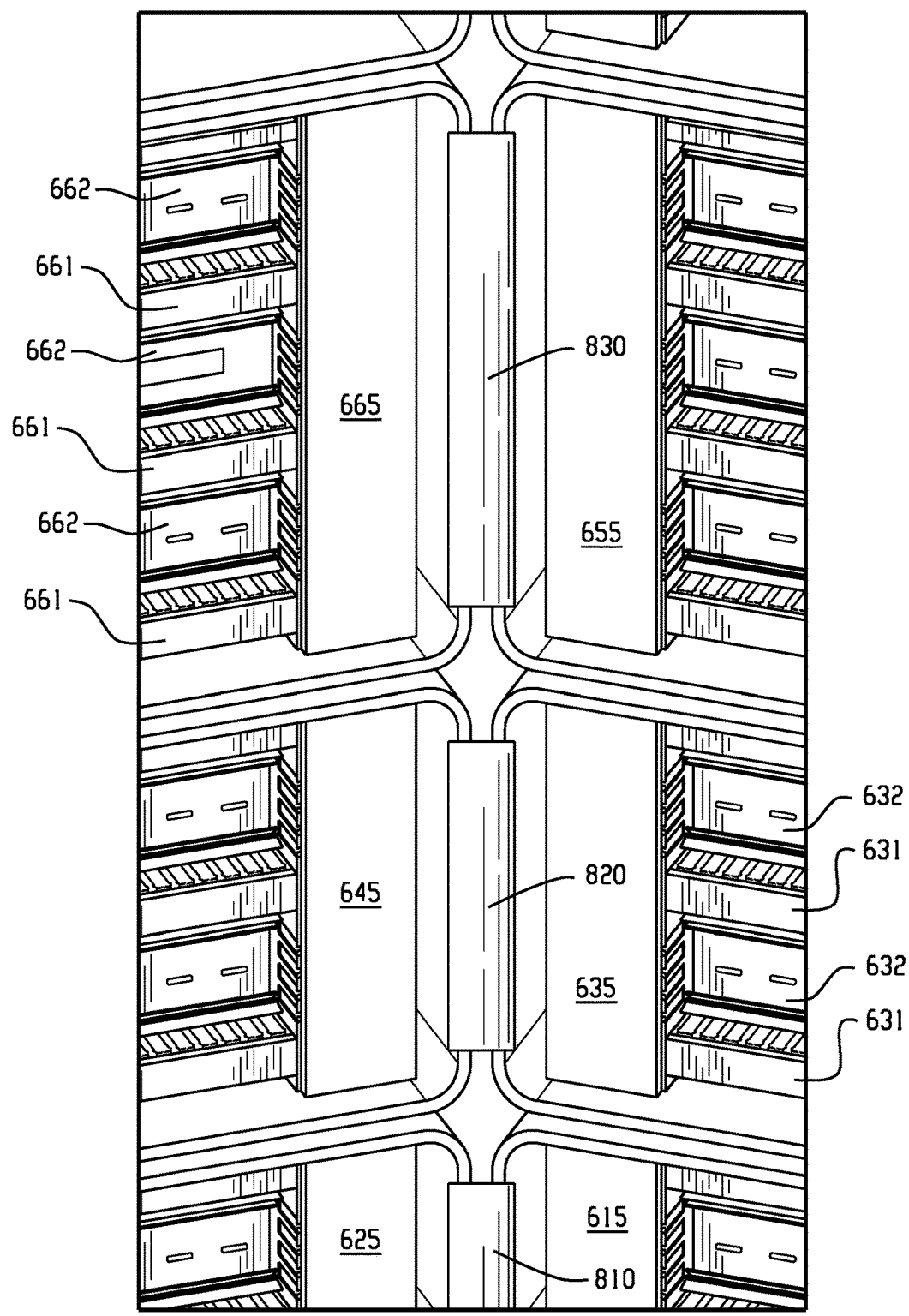
FIG. 9 is a perspective view of a portion of multiple enclosures in open positions.

FIG. 6 shows a perspective view of multiple enclosures mounted and in open positions and FIG. 9 provides a close up of details of the multiple enclosures mounted and in open positions. FIGS. 7-8 provide details of an extra cable management area 750.

As shown in the example of FIG. 6, the multiple enclosures are sized modularly and each has the same width. A first enclosure has a first base 670 with a base vertical cable management area and no electronic component mounting areas or horizontal cable management areas. A first door 680 is empty.

As is also shown in FIG. 6 with additional detail provided in FIG. 9, second, third, and fourth enclosures are shown mounted below the first enclosure and in vertical alignment with the first enclosure. In this example, the second enclosure is the largest and has room for three sets of second door electronic component mounting areas 661, three sets of second door horizontal cable management areas 662, and a second door vertical cable management area 665. The second base 650 likewise has three sets of electronic component mounting areas and horizontal cable management areas and also has a second base vertical cable management area 655.

One exemplary electronic component 664 is shown mounted in the an electronic component mounting area 662 of the second door 660. In some examples, electronic component can be mounted by using slots provided in the electronic component mounting area. In some examples, electronic components can be mounted using retaining clips (not shown) of the electronic component mounting area.

In the example of FIG. 6 with additional detail provided in FIG. 9, the third enclosure has a third base 630 and third door 640, each with two electronic component mounting areas, two horizontal cable management areas, and a vertical cable management area. As shown in the detail provided by FIG. 9, the storage areas are organized in similar fashion as in the second storage area. For example, third base 630 has two third base horizontal cable management areas 631, two third base horizontal cable management areas 632, and one vertical cable management area 635.

A fourth enclosure is shown at the bottom of the stack with one electronic component mounting area, one horizontal cable management area, and one vertical management area in the fourth base 610 and fourth door 620.

A flexible material can be used to cover the joint between a base and a door of an enclosure. In the example shown in FIG. 6 with additional detail provided in FIG. 9, no covering is used between the first base 670 and first door 680. However, the joints between the base and door of the second, third, and fourth enclosures are covered respectively with a second joint covering 830, a third joint covering 820, and a fourth joint covering 810.

As is also depicted in the example of FIG. 6 with additional detail of FIGS. 7 and 8, an extra cable management area 750 can be used to store cables. The extra cable management area 750 can be mounted on the first base 670 at its top base opening, permitting cables to extend from the extra cable management area 750 into the vertical cable management area of the first base. As shown in FIGS. 7 and 8, the extra cable management area 750 can include an extra cable management area base 752 and an extra cable management access panel 753, which is removable. Optimally, a lock 754 can secure the extra cable management access panel 753. Extra cable management top openings 755 can also be included to allow cables and wires to extend through the top surface of the extra cable management area 750. Optionally, the top surface of the extra cable management area can be scored, perforated, or otherwise weakened to to create punch-outs, allowing the user to create the extra cable management top openings 755.

The vertical cable management areas can be used to allow commutation of wires between and among electronic component mounting areas within a door or base of an enclosure. In some examples, the enclosures can also allow communication between and among enclosures and between an enclosure and the extra cable management area. In some examples, the top base opening and bottom base opening of each enclosure can be opened to permit the passage of wires or cables from one enclosure to the next.

In the example shown in FIG. 6 and with additional detail provided in FIG. 9, a cable or wire could be passed from the extra cable management area 750, through a top opening (not shown) of the first base 670, and through the first base vertical cable management area 675, through a bottom opening (not shown) of the first base 670. In like manner, the cable or wire could pass through the remaining base vertical cable management areas 655, 635, and 615.

In other examples, the doors of the enclosures could likewise be configured with top and bottom openings to permit communication of the door vertical cable management areas. Alternatively, the door could be configured without top and bottom door openings allowing the vertical cable management areas within each door to manage wires and cables between door component mounting areas within the door storage area but not between doors.

Figure 10:
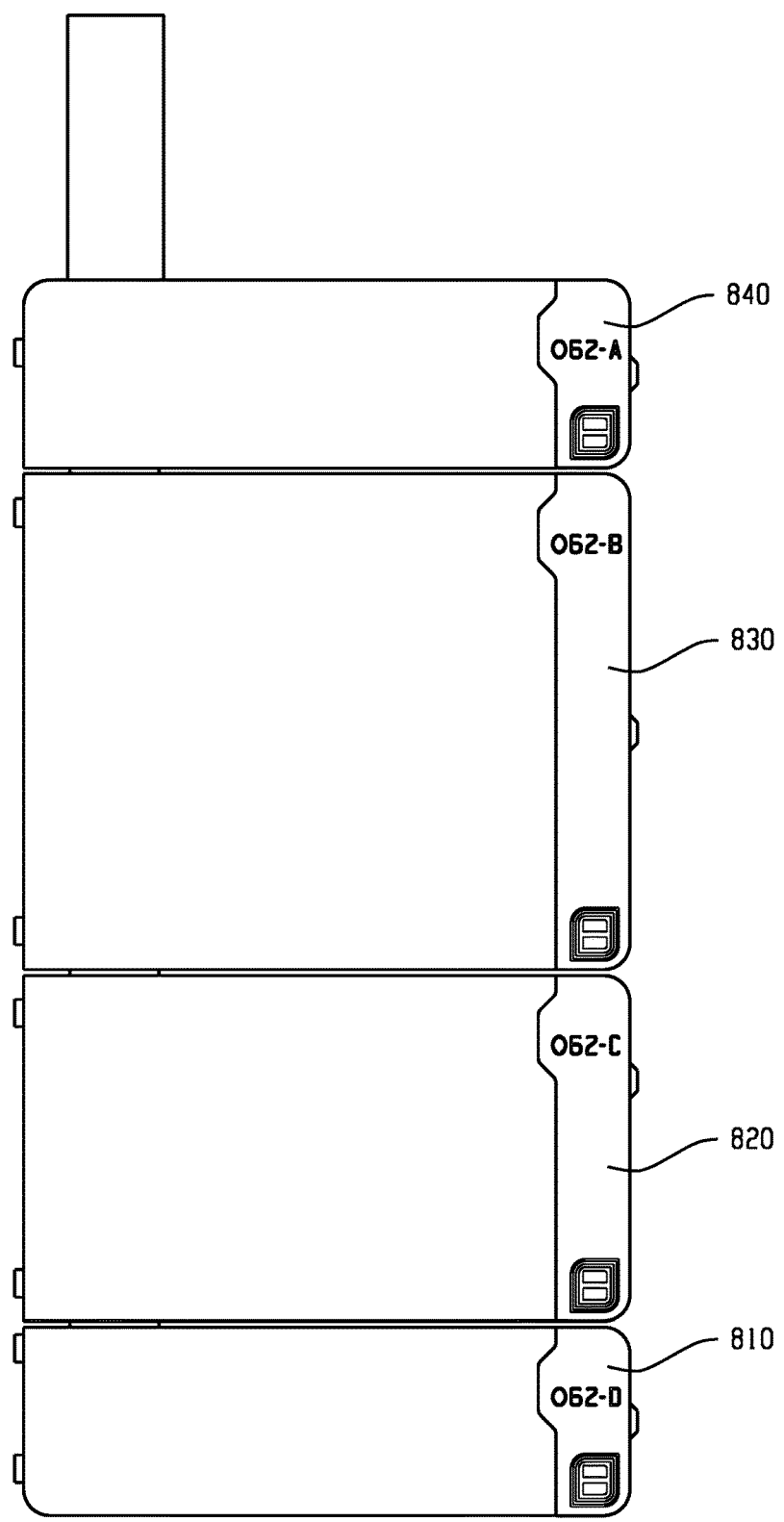
FIG. 10 is a front view of multiple enclosures with external labeling.

In FIG. 10, a frontal view of multiple enclosures is shown. External labeling identifies each enclosure. For example, a first label 840 is applied to a first enclosure, a second label 830 is applied to a second enclosure, a third label 820 is applied to a third enclosure, and a fourth label 810 is applied to a fourth enclosure.

Figure 11:
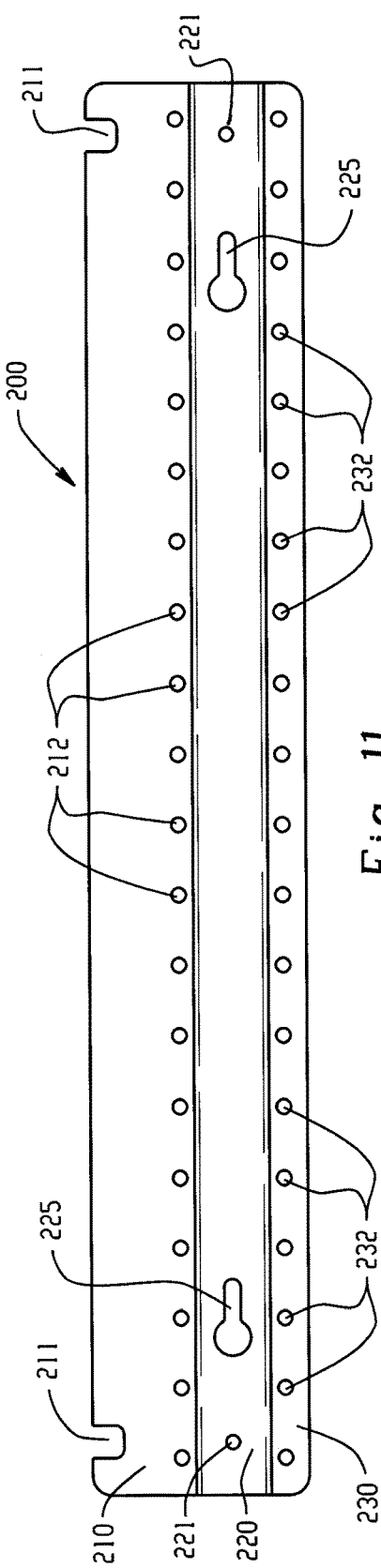
FIG. 11 is a front view of a bracket.
Figure 12:
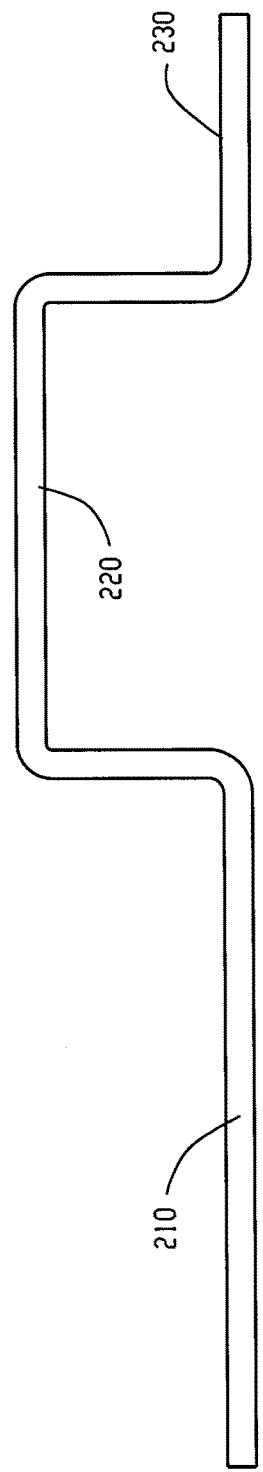
FIG. 12 is a side view of a bracket.
Figure 13:
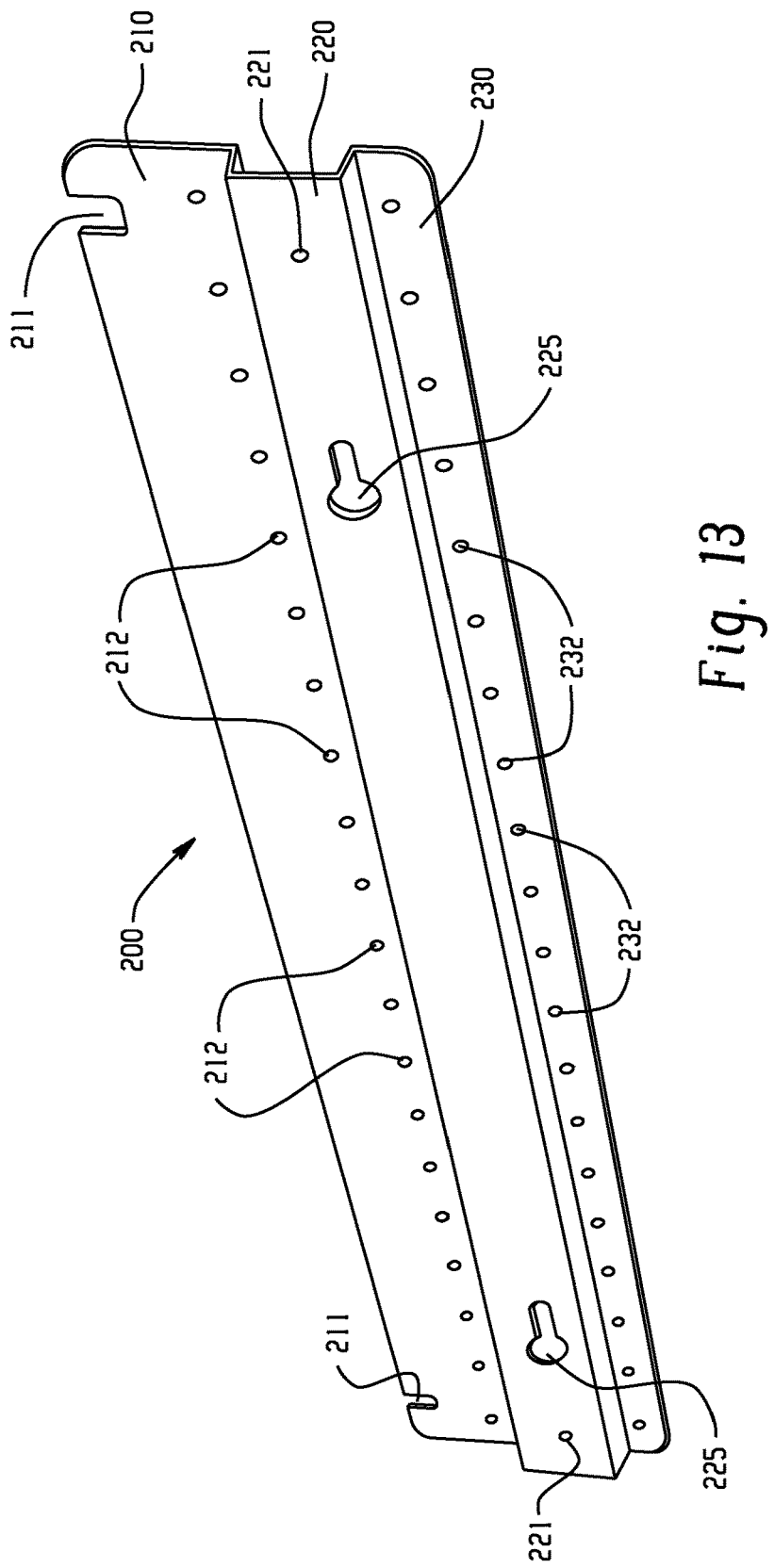
FIG. 13 is a perspective view of a bracket.

Turning now to FIGS. 11, 12, and 13, a bracket 200 is shown. The bracket can have first, second, and third surfaces 210, 220, and 230 respectively. First surface 210 can include notches 211 and wall fastening holes 212. Second surface 220 can have slide mounting openings 225 and second surface fastening holes 221. Third surface 230 can have third surface fastening holes 232. As shown, first, second, and third surfaces 210, 220, and 230 can be parallel to one another with the first surface 210 and third surface 230 in one plane and the second surface 220 in a different plane, such that when the bracket 200 is anchored to a wall the second surface 220 juts out from the wall, creating headroom between second surface 220 and the wall.

Figure 14:
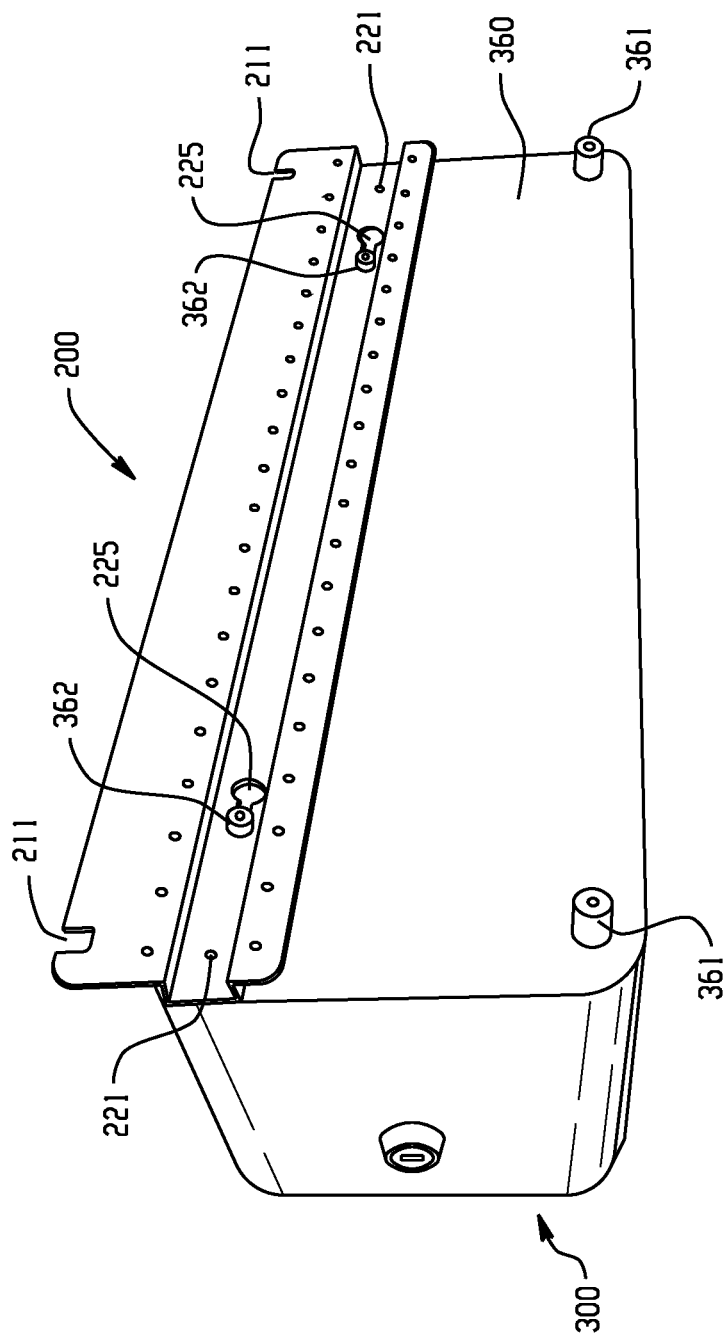
FIG. 14 is a perspective view of a bracket and an enclosure.

In FIG. 14 an enclosure 300 has been attached to a bracket 200. On the enclosure exterior backside 360 are shown two base mating portions 362 that have been inserted to slide mounting openings 225. As also shown in FIG. 14, the enclosure exterior backside 360 can have pegs 361. In examples where the enclosures are mounted substantially vertically level, the pegs 361 can be sized to match the distance of the set off between the second surface 220 and the first and third surfaces 210 and 230 of the bracket 200.

Figure 15:
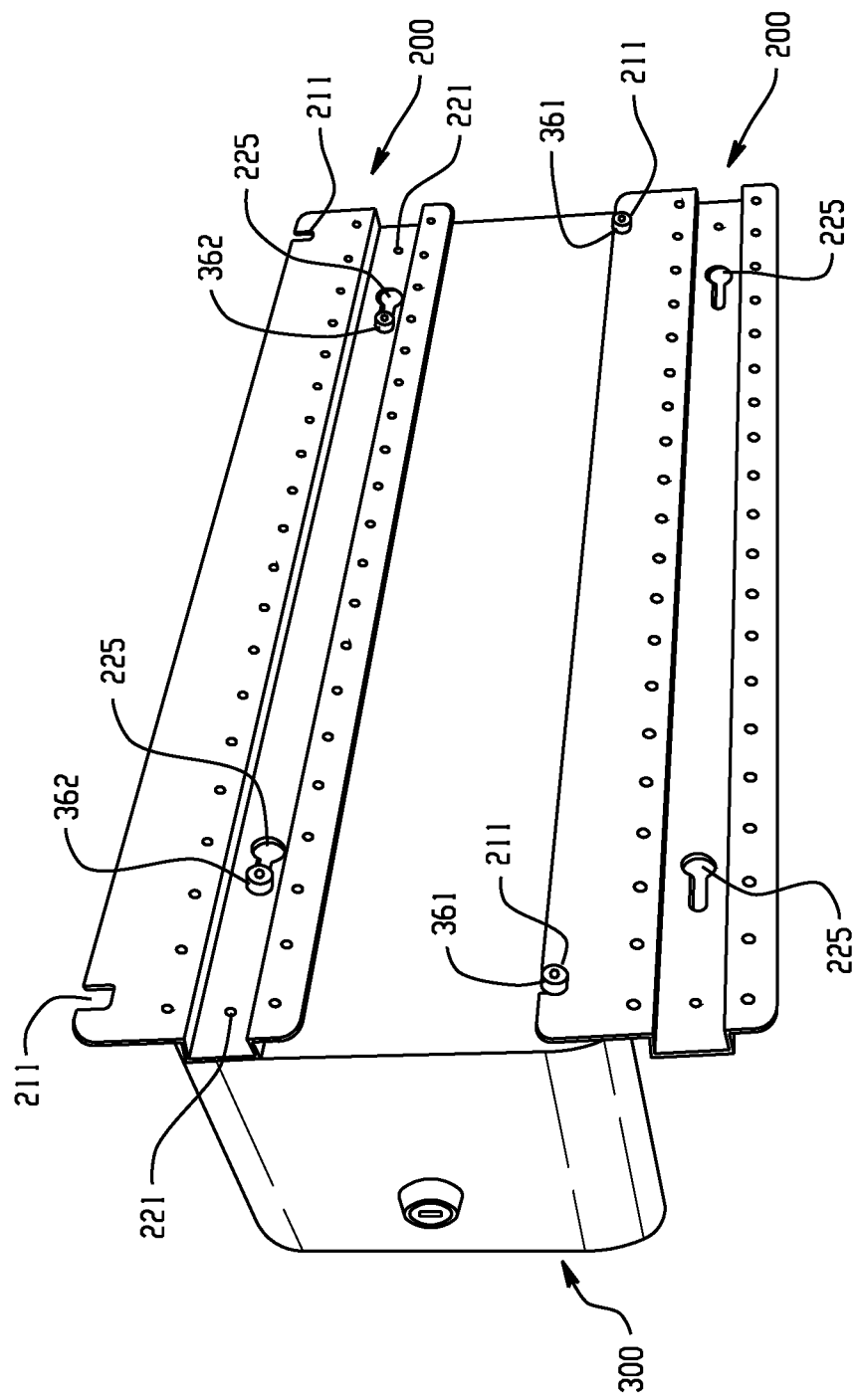
FIG. 15 is a perspective view of two brackets and an enclosure.

As shown in FIG. 15, the pegs 361 can also be used to align a subsequent bracket by mating the notches 211 of the subsequent bracket to the pegs 361 of a previously installed enclosure. As shown in the figure, the notches 211 of the topmost bracket are not used for alignment but the notches 211 of the next bracket are mated to the pegs 361.

Figure 16:
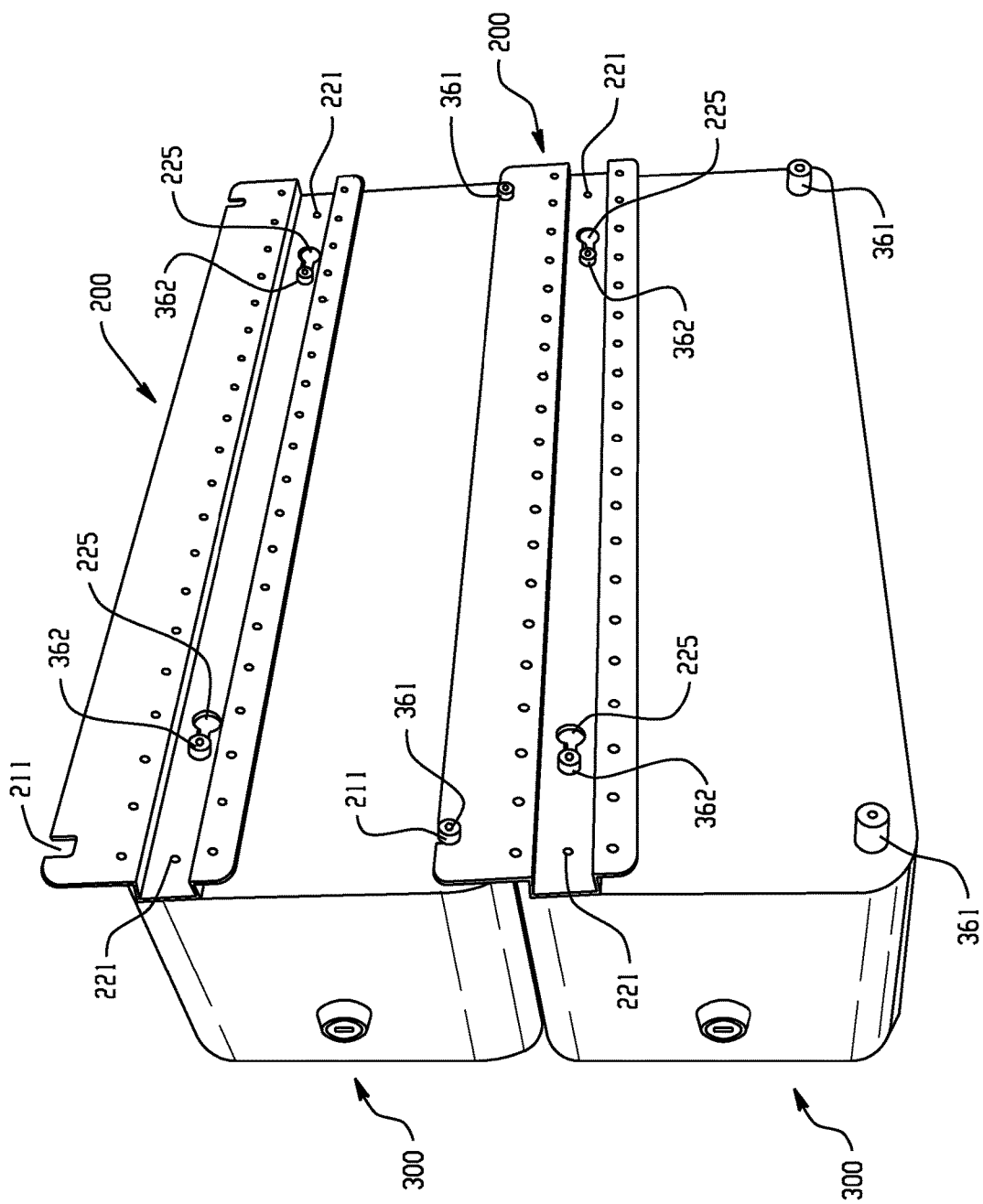
FIG. 16 is a perspective view of two brackets and two enclosures.

As shown in FIG. 16, the second enclosure can be mounted on second bracket. In this way, only the first bracket in a series of vertically aligned brackets and enclosures needs to be leveled and the remainder can be easily installed in a substantially level fashion without the need to use a level for each subsequent bracket.

Figure 17:
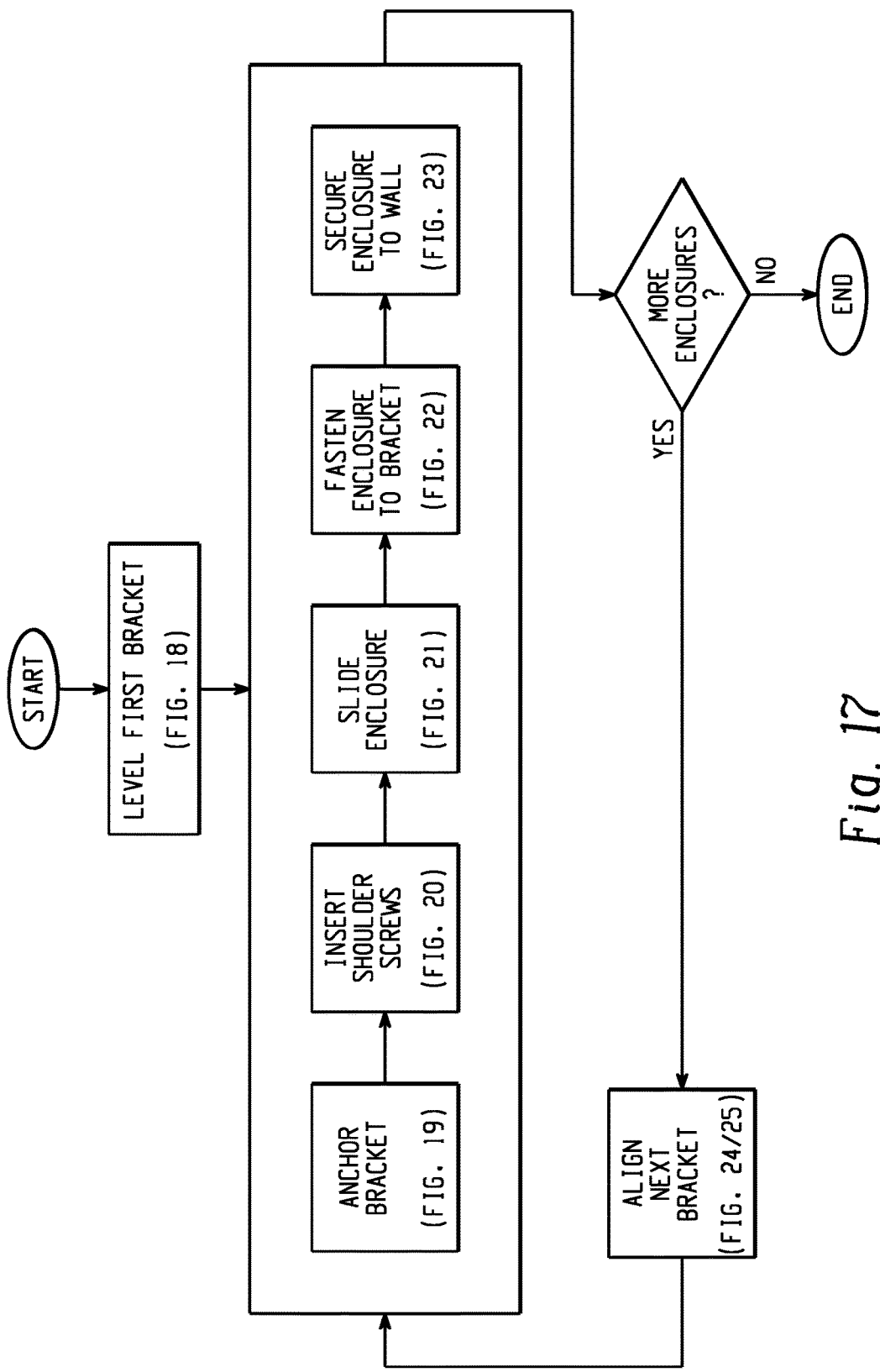
FIG. 17 is a schematic of a method of installing enclosures with brackets.
Figure 18:
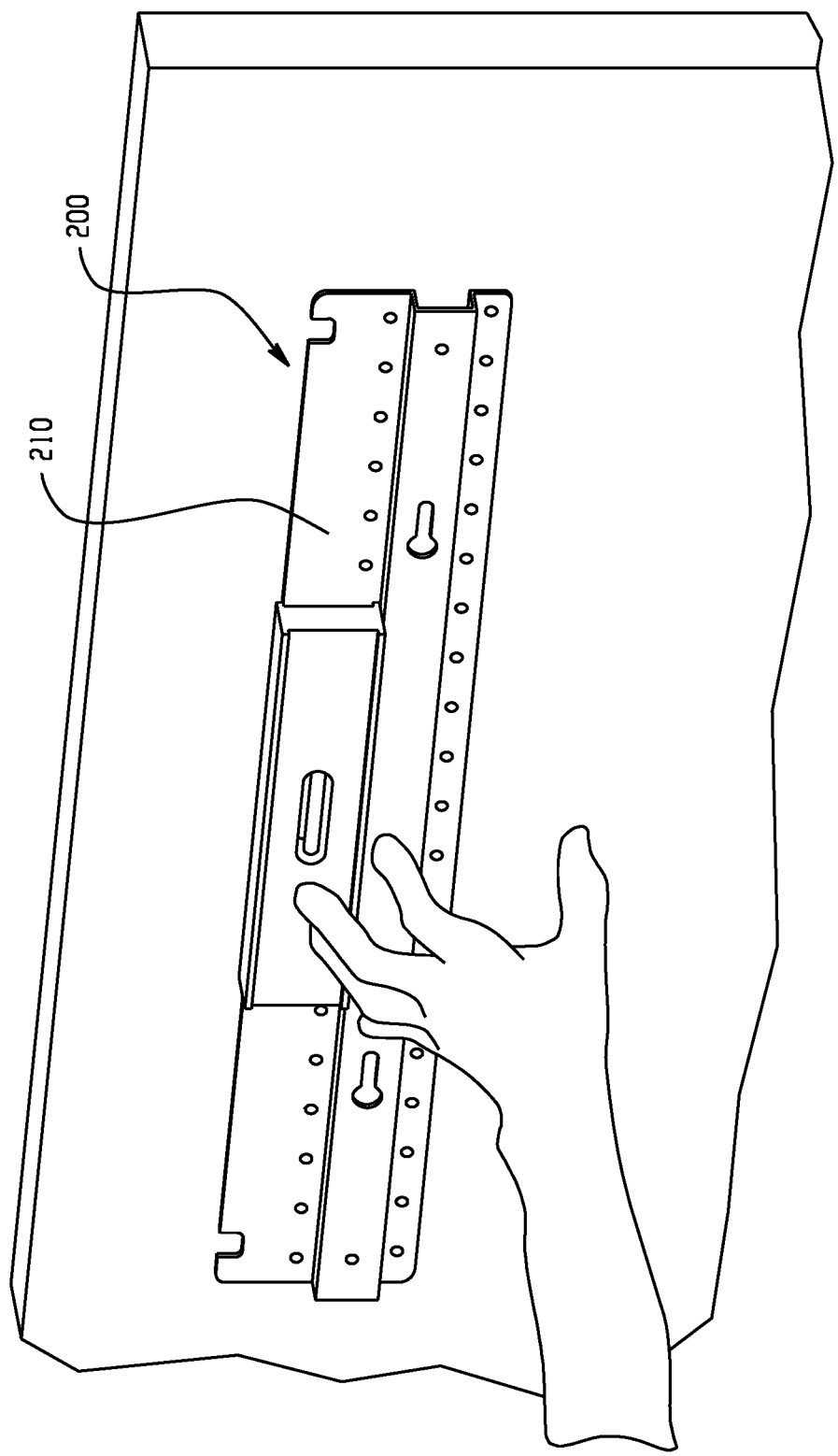

Turning now to FIG. 17, a method of installing an electronic enclosure component system containing one or more enclosures is shown. The first step in the method is to level the first bracket. As shown in FIG. 18, this step can be accomplished by placing a level on the first surface 210 of the bracket 200 and adjusting the bracket 200 until a level reading is indicated.

Figure 19:
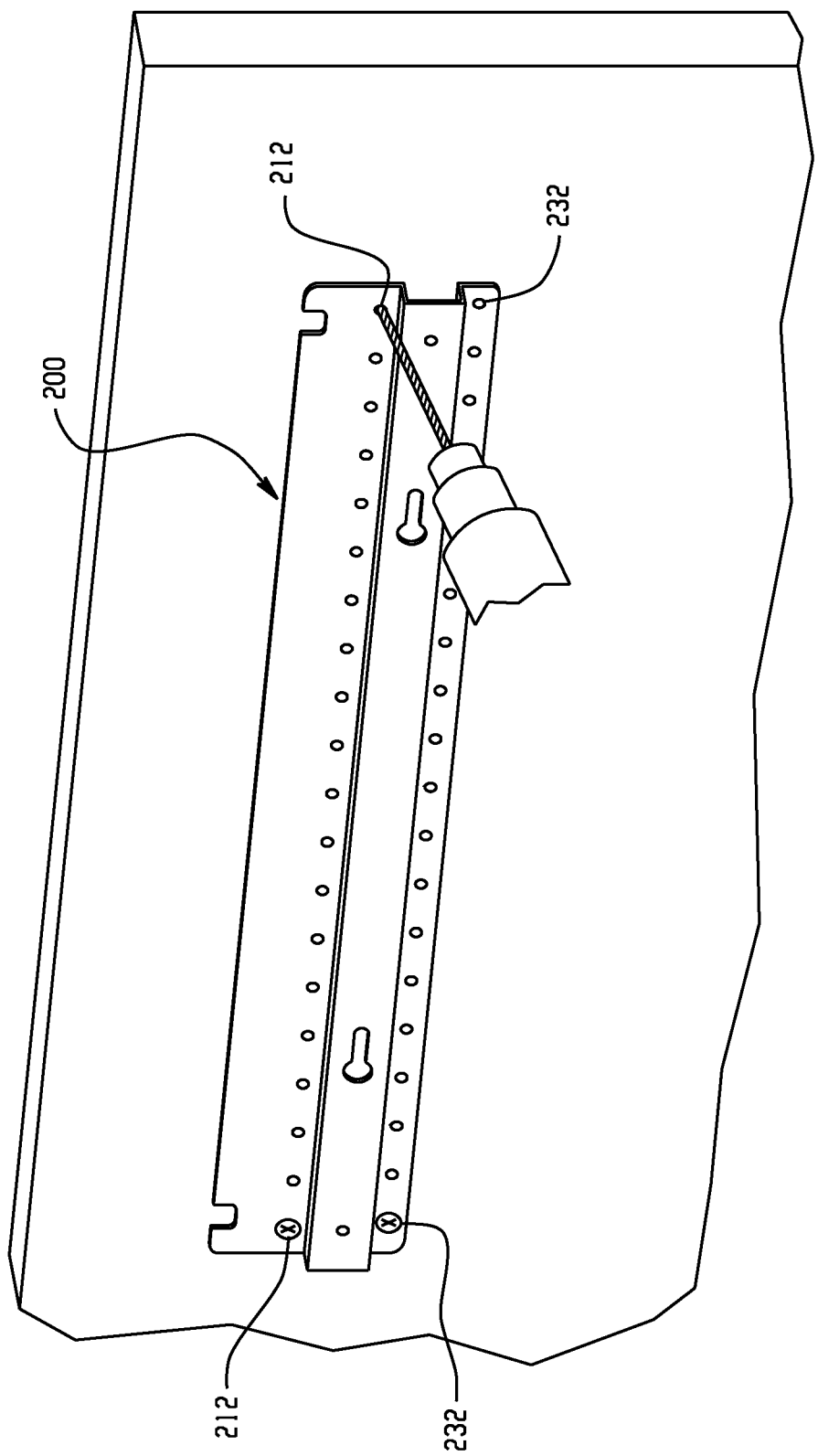
Figure 20:
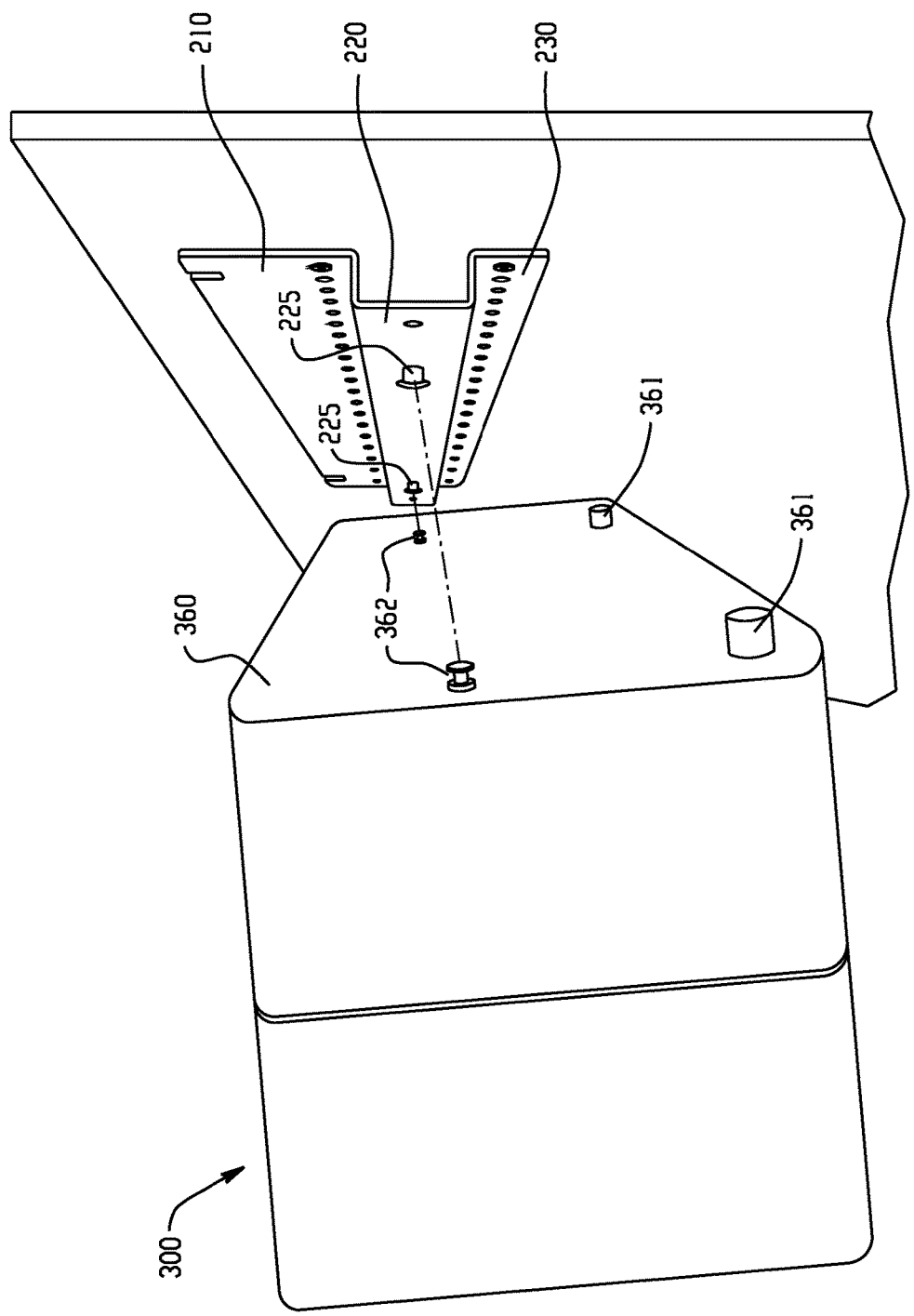

Next, the bracket can be anchored to a wall. FIG. 19 illustrates anchoring a bracket 200 by inserting a fastener through selected first surface fastening holes 212 and selected third surface fastening holes 232. The plurality of fastening holes on the bracket 200 can allow the installer to select a preferred location on the wall to anchor the bracket 200. For example, the installer may prefer to install the bracket where a wall stud is present and may therefore select a fastening hole among the plurality of first and third surface fastening holes to accomplish this objective. Not all fastening holes need be used.

Screws are shown as the fasteners in the example of FIG. 19. However, the invention is not limited to any particular fastener. Any suitable fastener can be used to securely anchor the bracket to the wall. For example, screws, nails, bolts, staples, pegs, dowels, etc. may be used.

The next step a method of installing an electronic enclosure component system containing one or more enclosures involves inserting the mating portions 362 on the enclosure's backside 360 into the slide mounting openings 225 of the bracket 200. As indicated in the figure, the mating portions 362 can be inserted into the rounded and relatively larger diameter portion of the slide mounting openings 225. One example of a mating portion 362 is a shoulder screw. However, the invention is not limited to any particular mating portion. Any suitable hardware for mating with the slide mounting openings 225 can be used.

Figure 21:
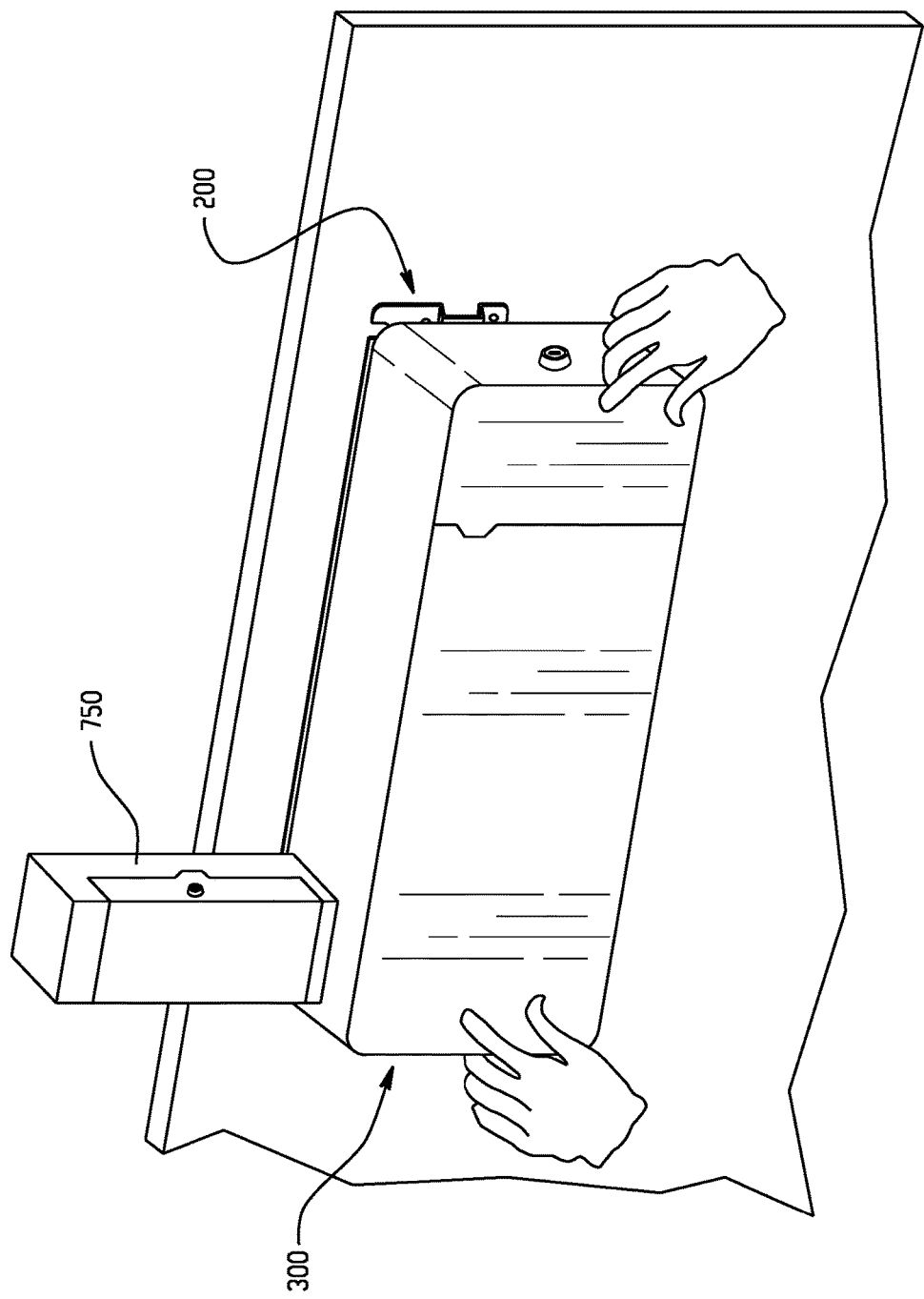

The next step is to slide the enclosure 300 such that the mating portions 362 will slide within the slide mounting openings 225 of the bracket 200 from the rounded portion and into the slotted portion of the slide mounting openings 225 so as to restrict the enclosure's vertical movement. FIG. 21 depicts an example of sliding an enclosure 300 into place on a bracket 200. In this step, the enclosure may be slid such that base fastening holes, such as first base fastening hole 313 in FIG. 22, are aligned with bracket fastening holes, such as the second surface fastening holes 221 shown in FIG. 13.

Next, the enclosure can be fastened to the bracket by inserting a fastener through a base fastening hole and into a bracket fastening hole so as to restrict the enclosure's horizontal movement. FIG. 22 depicts an example of fastening the enclosure to the bracket by inserting a fastener into a first base fastening hole 313. In some examples, two or more base fastening holes can be used to fasten the enclosure to the bracket.

Figure 23:
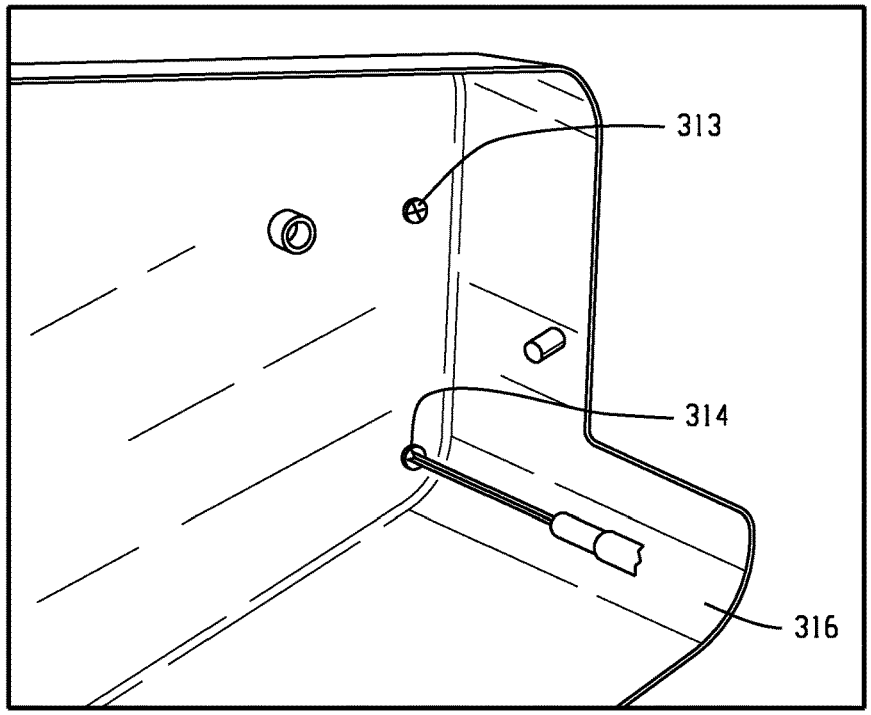

Next, the enclosure can be secured to the wall. FIG. 23 depicts an example of securing an enclosure to a wall by inserting a fastener through a second base fastening hole 314 and into the wall (not shown). In some examples, two or more base fastening holes can be used to fasten the enclosure to the wall.

Figure 22:
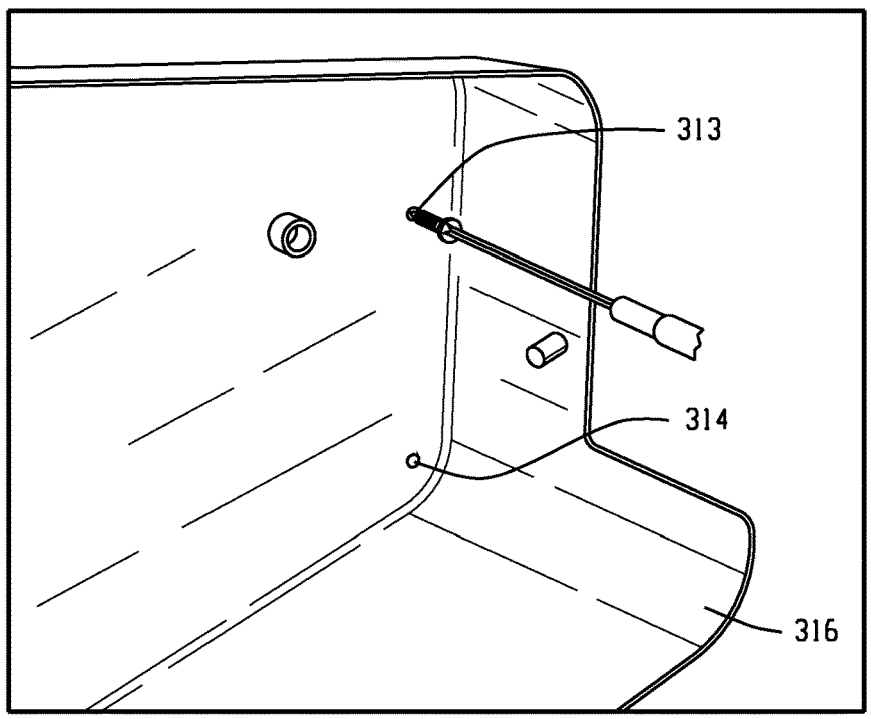

FIGS. 22 and 23 also depict an example of a body of an enclosure that may be used in applications in which a relatively large object such as a battery is to be stored. The lower area of the base of the enclosure in these drawings includes an extended portion 316 suitable for enclosing a larger object. Such a configuration of the base would be mirrored with a door that has a an extended upper portion such that when closed the base and door join together.

The next step in the method of installing an electronic enclosure component system containing one or more enclosures is to determine if additional enclosures will be mounted. If not, then the method is complete.

Figure 25:
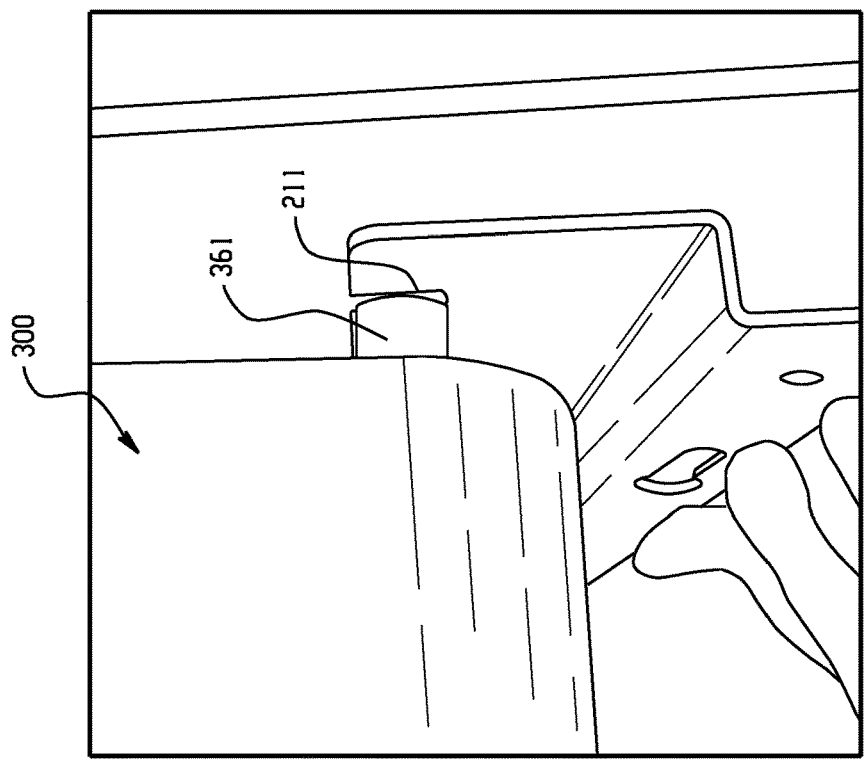
Figure 24:
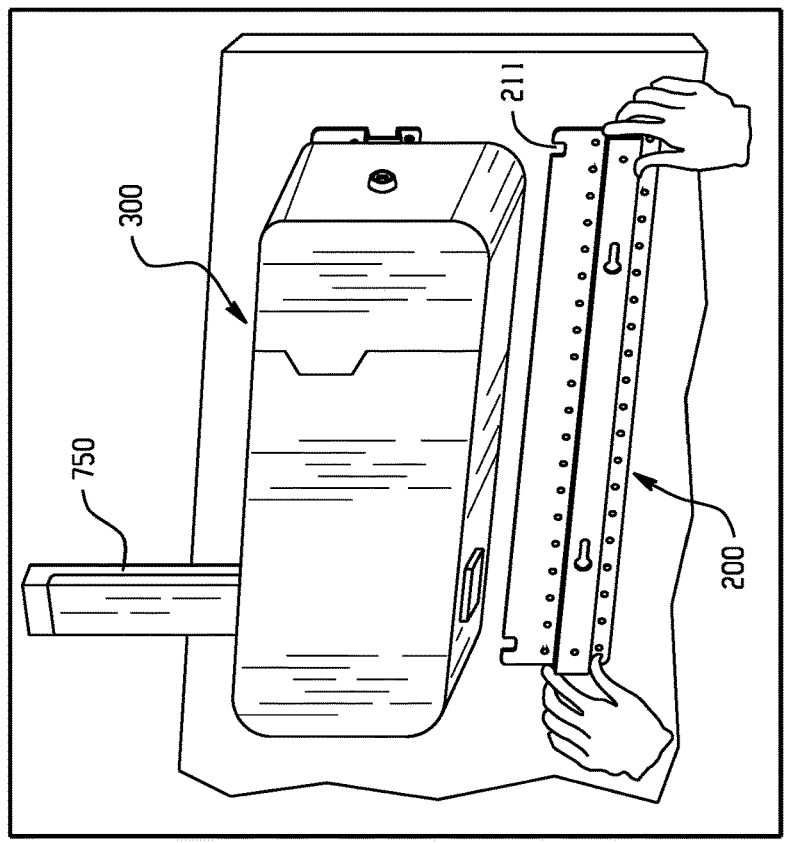

However, if additional enclosures are to be mounted then the method proceeds by aligning the next bracket. FIGS. 24 and 25 depict an example of aligning a next bracket. In this example, notches 211 on the bracket 200 are mated with pegs 361 of the previously installed enclosure 300.

Figure 27:
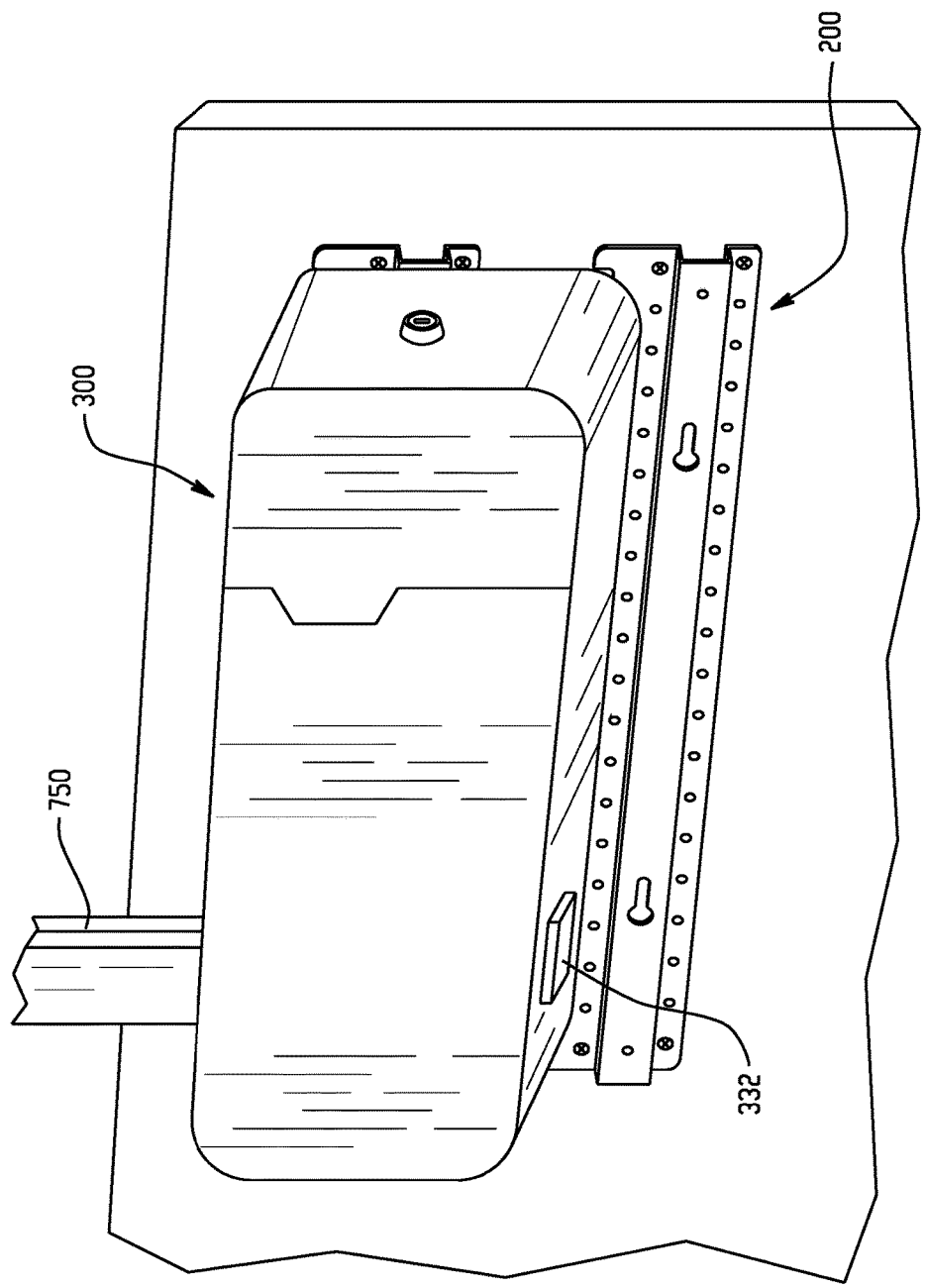

Once aligned, the next bracket can be anchored to the wall in the same manner as the previous bracket by inserting fasteners through selected bracket fastening holes of the bracket on its first and third surfaces. FIGS. 26 and 27 are exemplary. If a removable covering 332 such depicted in FIG. 27 interferes with the installation of the next bracket, for example because it blocks the installer from accessing a first surface fastening hole on the bracket, then the removable covering 332 can be removed and optionally replaced after the bracket is anchored.

Figure 28:
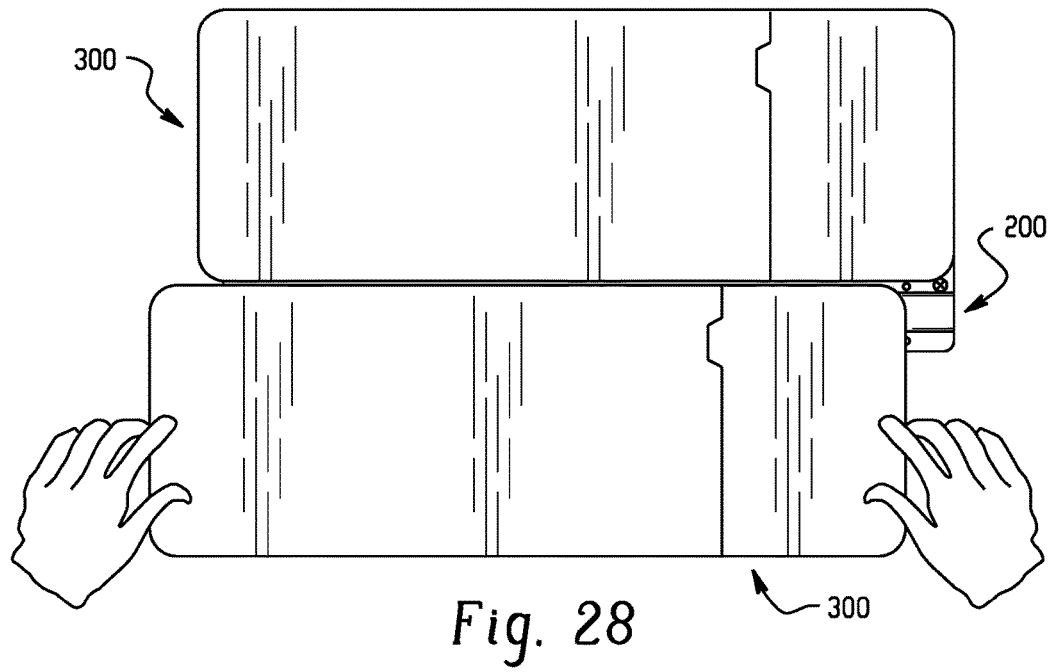
Figure 29:
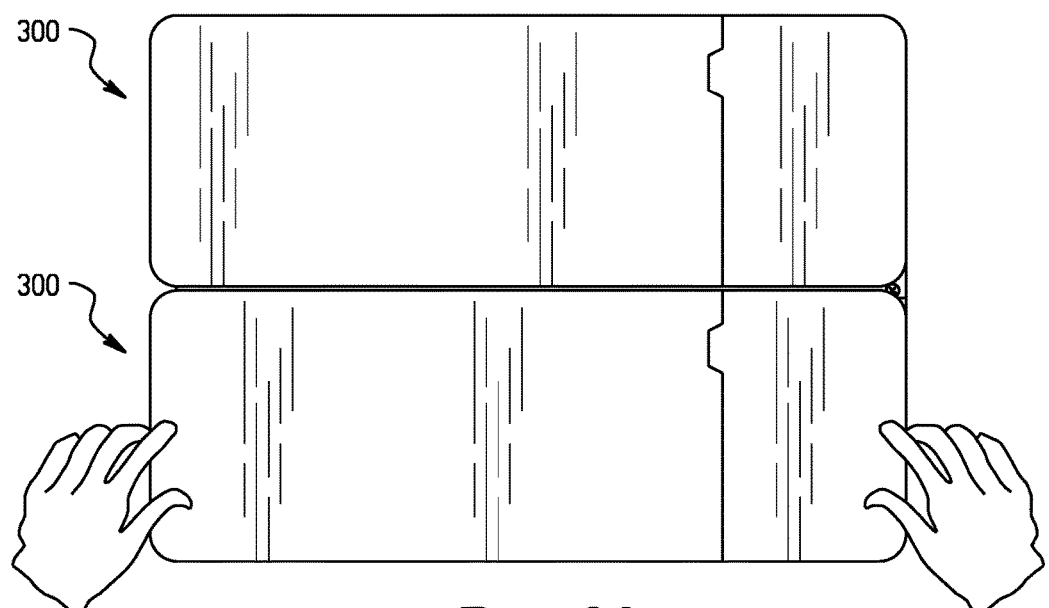
Figure 30:
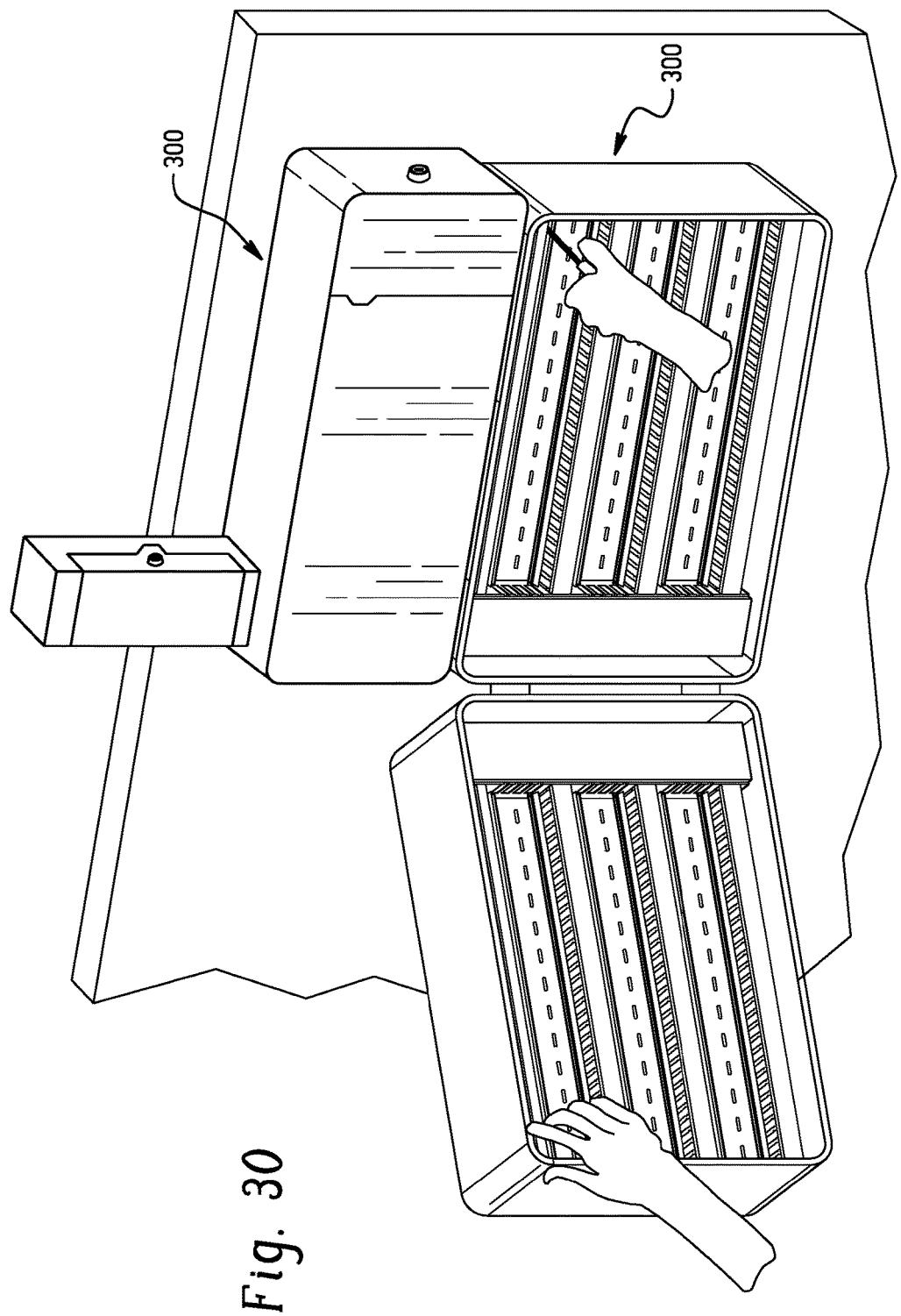

As before, the next enclosure can then be mated with the bracket by inserting base mounting portions of the enclosure, such as shoulder screws, into slideable mounting openings of the bracket and then the enclosure can be slid into place. FIGS. 28 and 29 are exemplary. Also as before, the next enclosure can be fastened to the bracket and to the wall, as shown in FIG. 30. In some examples, if the door of an enclosure is particularly heavy the installer may temporarily support the door during installation. In other examples, such as lighter doors or stronger enclosure materials and hinges, the door may not require support during installation.

These steps can be repeated beginning with the step of aligning a next bracket until all desired enclosures have been mounted.

In this disclosure, any identification of specific shapes, materials, techniques, and the like are either related to a specific example presented or are merely a general description of such a shape, material, technique, or the like. Identifications of specific details are not intended to be and should not be construed as mandatory or limiting unless specifically designated as such. Selected examples of enclosures, brackets, and methods of installation are disclosed and described in detail below. It should be noted that those having an ordinary level of skill in this area will recognize from reading this disclosure that various components of the disclosed apparatuses can be combined in ways not specifically shown in the examples to create an additional specific configuration. For ease of understanding and readability, no attempt is made to catalog every possible combination of the disclosed components.

Numerical ranges and parameters set forth approximations of the broad scope of the disclosed systems and methods. The numerical values set forth in the specific examples, are reported as precisely as possible. Any numerical value, however, inherently contains certain errors necessarily resulting from the standard deviation found in their respective testing measurements.

Furthermore, while the devices, systems, methods, and so on have been illustrated by describing examples, and while the examples, have been described in considerable detail, it is not the intention of the applicant to restrict, or in any way, limit the scope of the appended claims to such detail. It is, of course, not possible to describe every conceivable combination of components or methodologies for purposes of describing the devices, systems, methods, and so on provided herein. Additional advantages and modifications will readily appear to those skilled in the art. Therefore, the invention, in its broader aspects, is not limited to the specific details and illustrative examples, shown and described. Accordingly, departures can be made from such details without departing from the spirit or scope of the applicant's general inventive concept. Thus, this application is intended to embrace alterations, modifications, and variations that fall within the scope of the appended claims. The preceding description is not meant to limit the scope of the invention. Rather, the scope of the invention is to be determined by the appended claims and their equivalents.

Directional terms such as "up", "down", "left", "right", and "over" are meant to reference the representations shown in figures and are not meant to restrict the particular arrangement of the various elements in the claimed apparatus or method.

Finally, to the extent that the term "includes" or "including" is employed in the detailed description or the claims, it is intended to be inclusive in a manner similar to the term "comprising," as that term is interpreted when employed as a transitional word in a claim. Furthermore, to the extent that the term "or" is employed in the claims e.g., A or B it is intended to mean "A or B or both." When the applicant intends to indicate "only A or B, but not both," then the term "only A or B but not both" will be employed. Similarly, when the applicant intends to indicate "one and only one" of A, B, or C, the applicant will employ the phrase "one and only one." Thus, use of the term "or" herein is the inclusive, and not the exclusive use.

What is claimed is:

1. An enclosure mounting system, comprising:
    at least one bracket, the bracket including
        a rigid body having first, second, and third parallel surfaces wherein the first and third surfaces are on one plane and the second surface is on a different plane,
        the first surface having at least two notches generally disposed at opposite ends of the first surface and a plurality of first surface fastening holes disposed along substantially the entire length of the first surface,
        the second surface having at least two slide mounting openings and at least one second surface fastening hole, and
        the third surface having a plurality of fastening holes disposed along substantially the entire length of the third surface; and
    wherein the bracket is configured to fasten to a wall and to an enclosure while permitting the enclosure to also fasten to the wall.

2. The enclosure mounting system of claim 1 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

3. The enclosure mounting system of claim 2 wherein the enclosure includes a door having a generally box shape open on one side forming a door storage area within the interior of the door.

4. The enclosure mounting system of claim 3 wherein the door of the enclosure is pivotally connected to the base along a vertical axis, forming a joint.

5. The enclosure mounting system of claim 4 wherein the enclosure includes a flexible material covering a portion of the joint.

6. The enclosure mounting system of claim 5 wherein the enclosure includes at least one electronic component mounting area within the base storage area and the door storage area.

7. The enclosure mounting system of claim 6 wherein the enclosure includes at least one horizontal cable management area within the base storage area and the door storage area.

8. The enclosure mounting system of claim 7 wherein the enclosure includes at least one vertical cable management area located within the base storage area and configured to permit a cable to pass vertically through the enclosure.

9. A method of installing an enclosure mounting system, which comprises:
    (a) leveling a bracket;
    (b) fastening the bracket to a wall;
    (c) fastening an enclosure to the bracket by inserting base mating portions of the enclosure into slideable mounting openings of the bracket, sliding the enclosure such that the base mating portions of the enclosure slide into a locked position of the slideable mounting openings and such that at least one base fastening hole of the enclosure is aligned with at least one bracket fastening hole of the bracket; and inserting at least one fastener through at least one base fastening hole of the enclosure and into at least one bracket fastening hole of the bracket;
    (d) fastening the enclosure to the wall by inserting at least one fastener through at least one base fastening hole of the enclosure and into the wall;
    (e) aligning a next bracket by inserting bracket slots into pegs extending from a previously installed enclosure; repeating steps (b), (c), and (d) to install a next enclosure on the next bracket; and
    (g) repeating steps (e) and (f) until all desired enclosures have been mounted.

10. The method of claim 9 wherein the bracket includes a rigid body having first, second, and third parallel surfaces wherein the first and third surfaces are on one plane and the second surface is on a different plane.

11. The method of claim 10 wherein the first surface has at least two notches generally disposed at opposite ends of the first surface and a plurality of first surface fastening holes disposed along the length of the first surface.

12. The method of claim 11 wherein the second surface has at least two slide mounting openings and at least one second surface fastening hole.

13. The method of claim 12 wherein the third surface has a plurality of fastening holes disposed along the length of the third surface.

14. The method of claim 13 wherein the bracket is configured to fasten to the wall and to the enclosure while permitting the enclosure to also fasten to the wall.

15. The method of claim 9 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

16. The method of claim 10 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

17. The method of claim 11 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

18. The method of claim 12 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

19. The method of claim 13 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

20. The method of claim 14 wherein the enclosure includes a base having a generally box shape open on one side and forming a base storage area within the interior of the base, the base including an exterior base mounting surface having at least two pegs configured to stand the base off of a wall, at least two base mating portions, and at least two base fastening holes.

* * * * *